United States Patent
Hatano et al.

(10) Patent No.: US 9,202,667 B2
(45) Date of Patent: Dec. 1, 2015

(54) CHARGED PARTICLE RADIATION DEVICE WITH BANDPASS DETECTION

(75) Inventors: Michio Hatano, Hitachinaka (JP); Tetsuya Sawahata, Hitachinaka (JP); Yasuko Watanabe, Mito (JP); Mitsugu Sato, Hitachinaka (JP); Sukehiro Ito, Hitachinaka (JP); Takashi Ohshima, Saitama (JP); Hiroyuki Honda, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 130 days.

(21) Appl. No.: 13/521,092

(22) PCT Filed: Aug. 11, 2010

(86) PCT No.: PCT/JP2010/005040
§ 371 (c)(1),
(2), (4) Date: Aug. 21, 2012

(87) PCT Pub. No.: WO2011/092757
PCT Pub. Date: Aug. 4, 2011

(65) Prior Publication Data
US 2013/0043388 A1    Feb. 21, 2013

(30) Foreign Application Priority Data
Jan. 27, 2010   (JP) ................. 2010-014989

(51) Int. Cl.
*H01J 37/28* (2006.01)
*H01J 37/244* (2006.01)
(52) U.S. Cl.
CPC ............... *H01J 37/244* (2013.01); *H01J 37/28* (2013.01); *H01J 2237/2448* (2013.01)

(58) Field of Classification Search
CPC .............. H01J 37/28; H01J 2237/0475; H01J 2237/2448; H01J 2237/057; H01J 2237/244; H01J 2237/2443; H01J 2237/24435; H01J 2237/0451; G01N 23/2251
USPC .................................................. 250/306, 310
See application file for complete search history.

(56) References Cited

U.S. PATENT DOCUMENTS 5,389,787 A    2/1995   Todokoro et al.
5,990,483 A    11/1999  Shariv et al.
6,130,429 A *  10/2000  Ambe et al. .................. 250/310
(Continued)

FOREIGN PATENT DOCUMENTS

JP    51-101463 A    9/1976
JP    51-108569 A    9/1976
(Continued)

*Primary Examiner* — Brooke Purinton
(74) *Attorney, Agent, or Firm* — Mattingly & Malur, PC

(57) ABSTRACT

Disclosed is a charged particle radiation device having a charged particle source which generates a charged particle as a probe, a charged particle optical system, a sample stage, a vacuum discharge system, an aperture which restricts a probe, a conductive film, and a charged particle detector, wherein the conductive film is provided at a position excluding the optical axis of the optical system between the sample stage and the aperture; and the distance between the sensing surface of the surface of the charged particle detector and the sample stage is larger than the distance between the sample stage and the conductive film, so that the surface of the conductive film and the sensing surface of the detector are inclined.

11 Claims, 20 Drawing Sheets

(56) References Cited

U.S. PATENT DOCUMENTS

| | | |
|---|---|---|
| 6,399,945 B1 | 6/2002 | Hirayanagi |
| 6,498,345 B1 * | 12/2002 | Weimer et al. .................... 850/9 |
| 6,646,262 B1 | 11/2003 | Todokoro et al. |
| 6,979,824 B1 * | 12/2005 | Adler et al. ....................... 850/9 |
| 7,755,045 B2 * | 7/2010 | Hatano et al. ................. 250/310 |
| 2003/0085353 A1 * | 5/2003 | Almogy et al. ............... 250/310 |
| 2003/0127604 A1 | 7/2003 | Todokoro et al. |
| 2004/0245465 A1 | 12/2004 | Steigerwald et al. |
| 2005/0001165 A1 * | 1/2005 | Parker ........................... 250/310 |
| 2008/0017797 A1 * | 1/2008 | Cheng et al. .................. 250/310 |
| 2008/0237465 A1 | 10/2008 | Hatano et al. |

FOREIGN PATENT DOCUMENTS

| | | |
|---|---|---|
| JP | 10-188883 A | 7/1988 |
| JP | 11-160438 A | 6/1999 |
| JP | 11-242941 A | 9/1999 |
| JP | 2000-48758 A | 2/2000 |
| JP | 2002-110079 A | 4/2002 |
| JP | 2004-221089 A | 8/2004 |
| JP | 2006-114426 A | 4/2006 |
| JP | 2008-243485 A | 10/2008 |
| WO | 99/46798 A1 | 9/1999 |
| WO | 01/75929 A1 | 10/2001 |

* cited by examiner

CHARGED PARTICLE RADIATION DEVICE WITH BANDPASS DETECTION

TECHNICAL FIELD

The present invention relates to a charged particle radiation device, particularly to a technology in which, in a charged particle radiation device for obtaining information of a surface of a sample by detecting a secondary particle generated from the sample with an electron beam typically accelerated at an accelerating voltage of 1 kV through 200 kV as a probe, with regard to an energy of an electron to be detected, the energy is detected by subjecting the energy to band-pass discrimination effectively and simply.

BACKGROUND ART

In a charged particle beam device which irradiates a top of a sample with a charged particle as a probe, detects a secondary particle that is generated from the sample in accordance with the irradiation, or a charged particle that transmits through the sample, and obtains information with regard to a probe irradiation position from an intensity that is detected, there are presented a number of methods of obtaining specific information by selecting and detecting an energy of the charged particle.

Particularly, in a scanning electron microscope which obtains a two-dimensional image of a scanning region by two-dimensionally scanning an electron beam probe on a sample, there are presented a number of methods of discriminating to detect an energy of a signal electron that is generated from the sample.

As methods of using the fact that a signal electron draws a trajectory which differs by an energy, there are presented methods of Japanese Unexamined Patent Application Publication No. 2004-221089 (applicant: Leo Elektronenmikroskopie GmbH), and Japanese Unexamined Patent Application Publication No. 2002-110079 (applicant: Hitachi, Ltd.) which provide a sensing surface of a detector at a position at which only an electron of a specific energy is detected.

As methods of using a porous plate-like electrode (mesh electrode) which applies a negative voltage that supplies an electric field of shielding an electron of a specific energy or less at an interval between a sample and a sensing surface of a detector in a case where a trajectory of a signal electron is not changed by an energy, there are presented methods of Japanese Unexamined Patent Application Publication No. Hei 11(1999)-242941 (applicant: Hitachi, Ltd.), and WO Publication No. 99/46798 (applicant: Hitachi, Ltd.).

However, all of these methods are methods for carrying out high-pass detection, or low-pass detection. It has been impossible, for example, to carry out band-pass detection which emphasizes to detect only an electron of 10 keV through 20 keV in a signal electron which has an energy width of 1 keV through 30 keV when an irradiation energy of a primary electron beam is 30 keV.

As methods of carrying out band-pass detection, there are presented various kinds of methods of making multi-stage electric field barriers between plural mesh electrodes by applying voltages which differ in steps on the plural electrodes, and confining signal electrons energy band-passes of which are selected into respective potential barriers and detecting the signal electrons.

In Japanese Unexamined Patent Application Publication Hei 10(1998)-188883 (applicant: SHIMADZU CORPORATION), there is presented a method of detecting signal electrons band-passes of which are selected as current signals from respective mesh electrodes via floating amplifiers. In Japanese Unexamined Patent Application Publication No. 2006-114426 (applicant: Hitachi, Ltd.), there is presented a method of detecting a signal electron a band-pass of which is selected by an electron detector which is provided at an interval of mesh electrodes.

However, according to the methods, there pose problems by nonuniformity of an electric field by using the mesh electrode and a three-dimensional obstacle by the electrode, and effective detection cannot be expected. Furthermore, both of the methods need plural high voltage power sources for supplying the shielding electric fields, and it is necessary to contrive to provide a pertinent electrostatic withstand voltage. Therefore, a simple and convenient detector is not configured.

In Japanese Unexamined Patent Application Publication No. Hei 11(1999)-160438 (applicant: EL-MUL TECHNOLOGIES LTD.), there is presented a method of providing a thin film between a sensing surface of an MCP (microchannel plate) detector which is an electron detector and a sample. An object thereof resides in an effective detection of a high energy electron even in an MCP sensitivity of which is maximized at a low energy of about 300 eV. The high energy electron is subjected to an energy attenuation by the thin film and transmits through the thin film from a side of the sensing surface of the MCP. Or, the high energy electron is transformed into a subsidiary electron of an extremely low energy (<100 eV) on the side of the sensing surface of the MCP of the thin film. Thereby, the high energy electron can effectively be detected by MCP by detecting the extremely low energy electron after the transformation at high sensitivity.

According to the method, it is anticipated that band-pass detection can be carried out when a film thickness of the thin film is pertinently selected, and an electron of a desired energy is transformed to have an energy of precisely about 300 eV. However, the more hardly the energy is attenuated, the more the extremely low energy electron that is produced by the high energy electron on the surface of MCP is detected. As a result, only an effect as a high-pass filter is expected. It is anticipated that it is impossible to carry out band-pass detection which is achieved by not detecting the high energy electron.

CITATION LIST

Patent Literatures

Patent Literature 1: Japanese Unexamined Patent Application Publication No. 2004-221089
Patent Literature 2: Japanese Unexamined Patent Application Publication No. 2002-110079
Patent Literature 3: Japanese Unexamined Patent Application Publication No. Hei 11(1999)-242941
Patent Literature 4: WO Publication No. 99/46798
Patent Literature 5: Japanese Unexamined Patent Application Publication No. Hei 10(1998)-188883
Patent Literature 6: Japanese Unexamined Patent Application Publication No. 2006-114426
Patent Literature 7: Japanese Unexamined Patent Application Publication No. Hei 11(1999)-160438

SUMMARY OF INVENTION

Technical Problem

As described above, simple and highly efficient band-pass detection of an electron has been difficult in any of technologies disclosed in the cited Patent Literatures 1 through 7 shown above.

It is an object of the present invention to provide an image of a scanning electron microscope having a simple and efficient energy band-pass of an electron with regard to an electron an energy of which is equal to or higher than 1 kV and equal to or lower than an irradiation energy of a primary electron beam which is generated from a sample in a scanning electron microscope that uses a primary electron beam accelerated typically at 1 kV through 200 kV as a probe.

Solution to Problem

According to the present invention, the problem described above is achieved by a combination of a conductive film which is provided at an interval between an aperture that restricts a probe irradiated to a sample and a sample stage, and an electron detector which has a sensing surface that has an angle of 30° through 150° relative to the conductive film, in a charged particle radiation device.

Advantageous Effects of Invention

According to such a configuration, simple and highly efficient band-pass detection can be carried out by a minimum configuration which does not need a high voltage and which does not have a three-dimensional obstacle such as a mesh.

BRIEF DESCRIPTION OF DRAWINGS

FIG. 1-2 is a diagram showing a basic configuration of a band-pass detector according to the present invention.

FIG. 1-3 is a diagram showing a basic configuration of a band-pass detector according to the present invention.

FIG. 1-4 is a diagram showing a basic configuration of a band-pass detector according to the present invention.

FIG. 2 is a diagram showing a scanning electron microscope according to a first embodiment.

FIG. 3 is a diagram showing a scanning electron microscope according to a second embodiment.

FIG. 4 is a diagram showing a scanning electron microscope according to a third embodiment.

DESCRIPTION OF EMBODIMENTS

Figure 1:
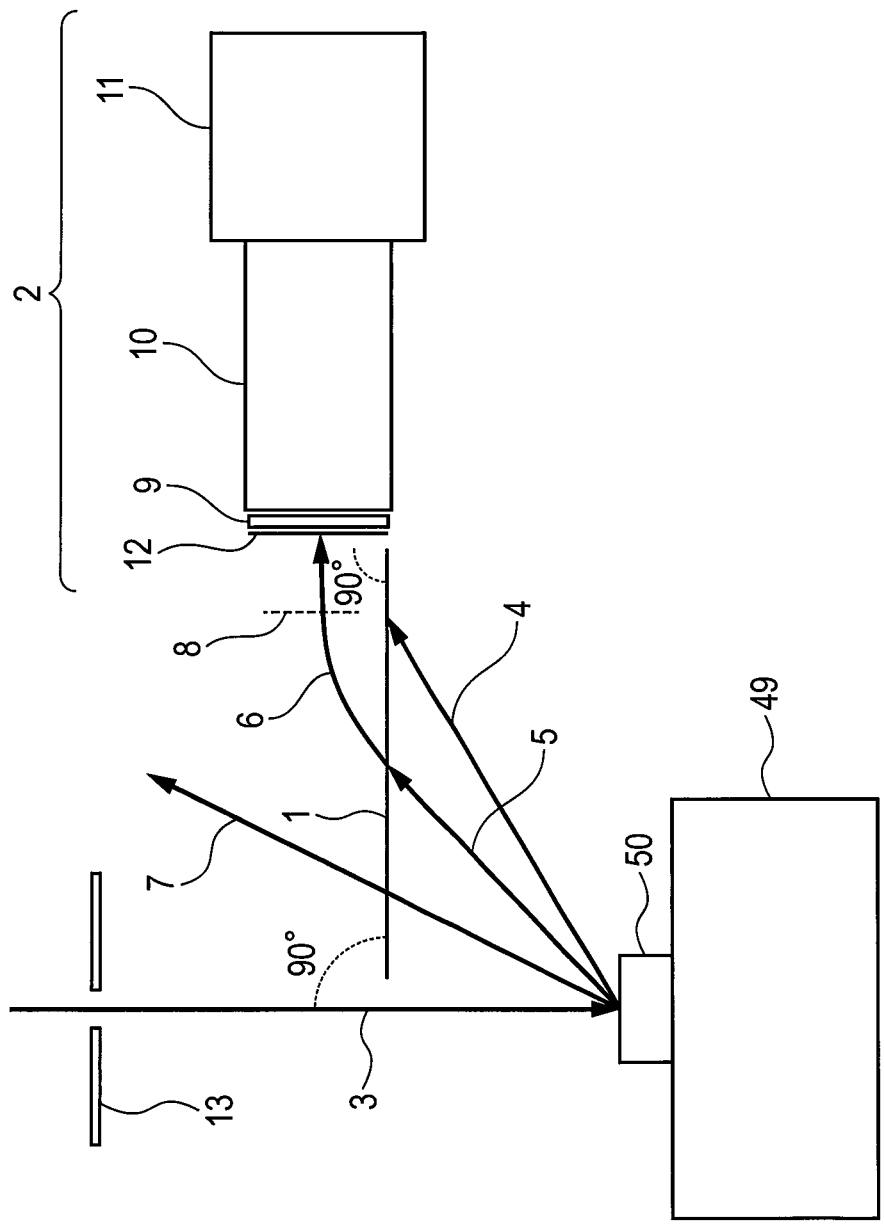
FIG. 1-1 is a diagram showing a basic configuration of a band-pass detector according to the present invention.

FIG. 1-1 shows a configuration which becomes a basis of an energy band-pass electron detector according to the present invention.

Hereinafter, for convenience of an explanation, of electrons having an energy equal to or higher than 1 keV and equal to or lower than an irradiation energy of a primary electron beam, an electron having an energy higher than a desired energy which is intended to be subjected to band-pass detection is referred to as a high energy electron, and an electron having an energy lower than the desired energy is referred to as a low energy electron. Also, an electron having an energy equal to or lower than 100 eV is referred to as an extremely low energy electron.

A conductive film 1 of aluminum, gold or the like having a thickness of 10-50000 nm is arranged on trajectories of signal electrons 5, 4, and 7. At this time, the conductive film 1 is arranged vertically to a primary electron beam with a likelihood of ±10°. An electron detector 2 in which a sensing surface thereof has an angle of 30° through 150° (90° in FIG. 1-1) relative to the conductive film 1 is arranged at a position which is remote from a sample by more than a distance between the conductive film 1 and the sample. At this time, the conductive film 1 is arranged to stay away from an optical axis of the primary electron beam 3 for passing the primary electron beam 3.

In signal electrons which are generated from the sample, the low energy electron 4 uses all the energy during a procedure of advancing in the conductive film, and is stopped at a position near to a face of the conductive film 1 on a side of the sample. Therefore, in the electron detector 2, a signal caused by the low energy electron is not detected.

The desired energy electron 5 advances although an energy thereof is being lost in the conductive film and transmits through the conductive film from a face of the conductive film on a side of the detector with a low energy equal to or lower than 1 keV. At this time, the electron 6 of an extremely low energy (several eV) is generated from a face of the conductive film on a side of the detector. As is generally known, a rate of generating the extremely low energy electron which is generated in impacting the electron depends on an energy of the electron impacted and a material of a substance impacted, and in a number of substances, the rate has a maximum value when the energy of the electron impacted is equal to or lower than 1 keV. It is known that in aluminum, the rate of generating the extremely low energy electron 6 is maximized by the electron of about 500 eV and is about 2.

On the other hand, the high energy electron 7 hardly loses the energy in the conductive film and passes through the conductive film by a trajectory which is substantially near to a linear line. The energy in passing through the conductive film is high, and therefore, the extremely low energy electrons which are generated from the face of the conductive film on the side of the detector are reduced. It is known that in aluminum, the rate of generating the extremely low energy electron 6 by the electron of about 10 keV is about 0.2.

As described above, by detecting the extremely low energy electron 6, only a signal which is caused by the electron of the desired energy can selectively be detected with emphasis, and band-pass detection of the electron is realized. When the signal obtained here is displayed at an image processing terminal in synchronism with scanning of the primary electron beam 3, there can be provided an image of the scanning electron microscope by the electron which is subjected to band-pass by the desired energy.

The electron detector 2 of detecting the extremely low energy electron 6 includes a scintillator 9, a photomultiplier 11, and a light guide 10 of guiding a photon which is generated from the scintillator to the photomultiplier. According to the embodiment shown here, a face of the scintillator which is a sensing surface of the detector is arranged with an angle of 90° relative to the conductive film. The angle of the sensing surface of the detector and the conductive film is not limited to 90° but the face of the scintillator may be arranged by an angle within a range equal to or larger than 30° and equal to or smaller than 150°. A surface of the scintillator 9 of the electron detector is provided with an accelerating electrode 12 in a shape of a thin film of applying a positive voltage of about 10 kV for accelerating the second electron. The accelerated extremely low energy electron 6 is impacted to the scintillator 9, and generates a photon. The photomultiplier 11 converts the photon into an electron to thereafter amplify with a high gain. Incidentally, the electron detector 2 is not limited to the configuration described above but may be, for example, an MCP (microchannel plate).

In order to prevent the high voltage which is applied to the accelerating electrode 12 from effecting influence on the primary electron beam 3, there may be provided an electrode 8 in a mesh-like shape which is maintained at the ground potential between the accelerating electrode 12 and an optical axis of the primary electron beam 3. A hole diameter of the mesh electrode 8 needs to be small to a degree by which an electric field produced by the accelerating electrode 12 does not effect an influence on the primary electron beam 3. However, the hole diameter needs to be large to a degree by which the electric field permeates the conductive film 1 which is a portion of generating the extremely low energy electron 6 to a degree of drawing the extremely low energy electron 6 to the scintillator 9.

In order to select an energy band subject to band-pass detection, a thickness of the conductive film 1 may be changed. For example, in a case where the conductive film is made of aluminum, a hole diameter may be made to be about 1 µm in a case where there is carried out band-pass detection in which the energy centers on 10 keV, and may be about 2.5 µm in a case where there is carried out band-pass detection in which the energy centers on 20 keV. In a case where band-pass detection is carried out in which the energy centers on a lower energy, the thickness of the conductive film may further be thinned.

In a case where the present detector is intended to be used as a high-pass filter, the thickness of the conductive film 1 may be selected such that an energy of a signal electron having a maximum energy (a value of which is substantially the same as that of the irradiation energy of the primary electron beam) is attenuated to a low energy equal to or lower than 1 keV.

The face of the conductive film on the side of the detector may be coated with a substance such as MgO, CsI, an aluminum oxide or the like having a thickness equal to or smaller than 100 nm in order to increase efficiency of generating the extremely low energy electron.

The electron detector 2 of detecting the extremely low energy electron 6 includes the scintillator 9, the photomultiplier 11, and the light guide 10 of guiding the photon that is generated from the scintillator to the photomultiplier.

The high energy electron 7 needs to be prevented from being detected directly as a condition which is indispensable for using the configuration of the detector as the band-pass filter. This is achieved by contriving an arrangement of the conductive film 1 and a face of the scintillator 9 which is the sensing surface of the detector.

According to the embodiment shown in FIG. 1-1, the conductive film is arranged vertically to the optical axis of the primary electron beam 3, and the face of the scintillator 9 which is the sensing surface of the detector is arranged relative to the conductive film with the angle of 90°. Here, attention should be paid so that the high energy electron 7 in which a change 101 in an angle of a trajectory of the electron 7 in passing the conductive film is confined to a change of ±10° or less is prevented from entering the sensing surface directly. Such an arrangement of the conductive film 1 and the sensing surface needs to be made for all of the embodiments hereinbelow.

The angle between the conductive film and the optical axis of the primary electron beam 3 and the angle between the sensing surface of the detector and the conductive film are not limited to 90°. An explanation will be given as follows of a variation in the angle between the conductive film and the sensing surface of the detector in the basic configuration of FIG. 1-1.

The angle between the conductive film and the optical axis of the primary electron beam is not limited to 90°±10° but may be an angle of, for example, 100° through 150°. At this time, the angle between the conductive film and the sensing surface of the detector is made to fall within a range of 30° through 150°. In an embodiment shown in FIG. 1-2, the conductive film 1 and the optical axis of the primary electron beam 3 are arranged with an angle of 120° therebetween. Also, the conductive film 1 and the face of the scintillator 9 which is the sensing surface of the detector are arranged with an angle of 60° therebetween. According to such a configuration, a direction of an initial speed of a number of the extremely low energy electrons 6 is directed to a direction of the sensing surface and detection efficiency is increased.

Figures 1, 2:
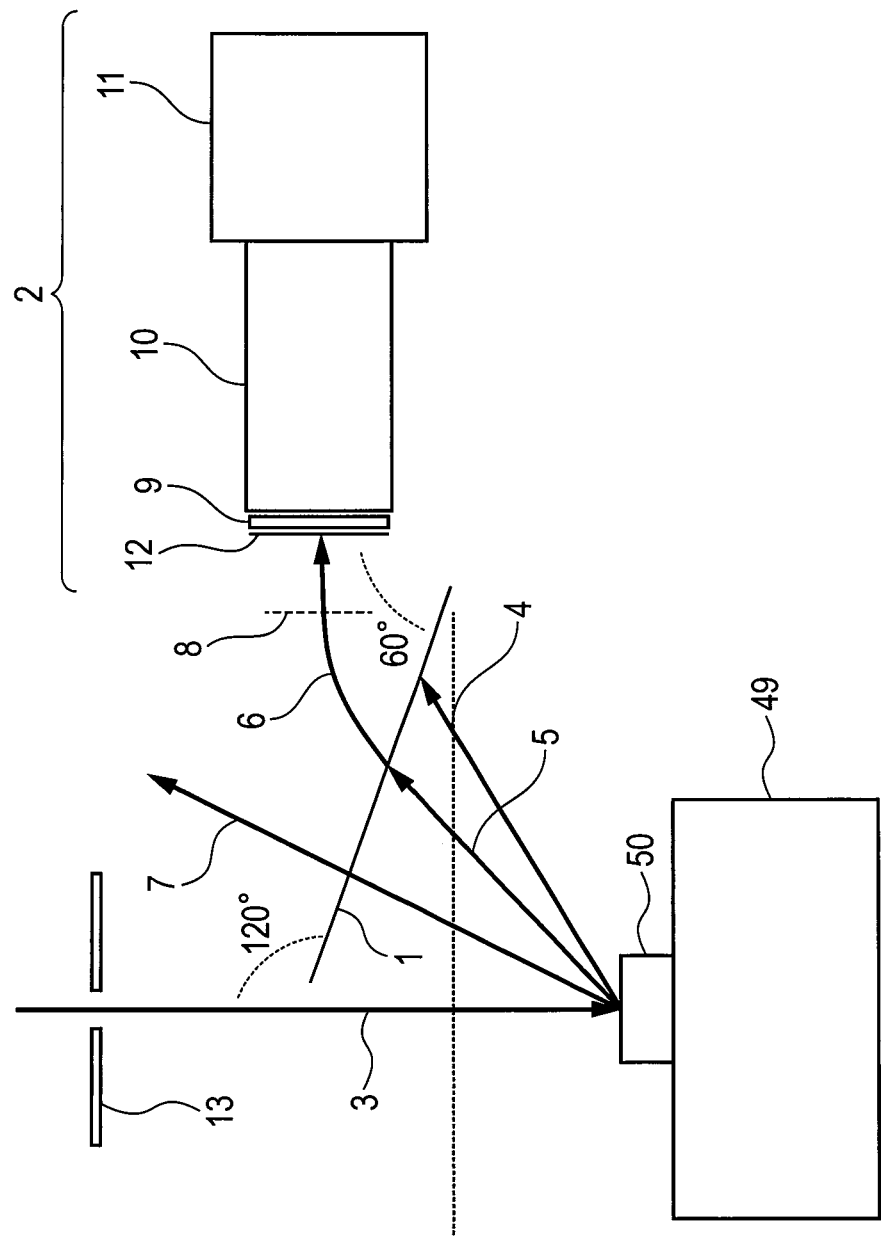
Figures 1, 2, 3:
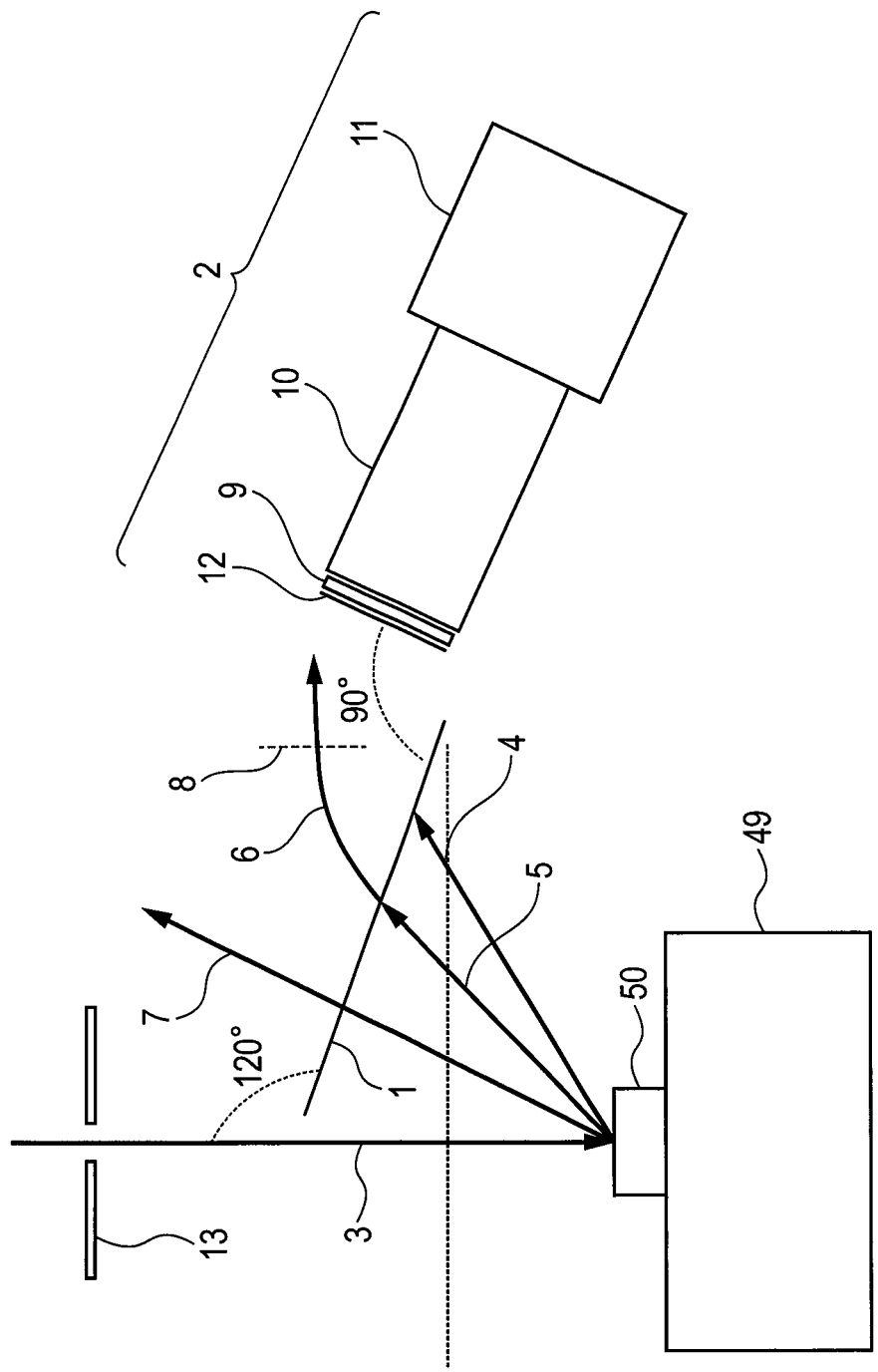

According to an embodiment shown in FIG. 1-3, the conductive film 1 and the optical axis of the primary electron beam 3 are arranged with the angle of 120° therebetween. Also, the conductive film 1 and the face of the scintillator 9 which is the sensing surface of the detector are arranged with an angle of 90° therebetween. According to such a configuration, the direction of the initial speed of a number of the extremely low energy electrons 6 is directed in the direction of the sensing surface and the detection efficiency is increased. In addition thereto, the high energy electron 7 which transmits through the conductive film 1 is made to be difficult to directly enter the surface of the scintillator 9 which is the sensing surface.

According to an embodiment shown in FIG. 1-4, the conductive film 1 and the optical axis of the primary electron beam 3 are arranged with the angle of 90° therebetween. Also, the conductive film 1 and the face of the scintillator 9 which is the sensing surface of the detector are arranged with an angle of 120° therebetween. According to such a configuration, the high energy electron 7 which transmits through the conductive film 1 is made to be difficult to enter directly to the face of the scintillator 9 which is the sensing surface.

An explanation will be given as follows of representative embodiments of the present invention in reference to the drawings.

First Embodiment

FIG. 2 shows a first embodiment of the present invention and is a view showing a total configuration of a scanning electron microscope including an energy band-pass electron detector.

The scanning electron microscope shown in FIG. 2 is generally configured by an electro-optical lens-barrel 13 including a mechanism of irradiating a sample with an electron beam, a sample base 49 which holds a sample 50, and a sample chamber 14 which stores the sample base 49, an information processing unit (not illustrated) which carries out control processing, various image processing, or information processing (not illustrated) which is related to a user interface as well as an image display terminal (not illustrated) which displays a scanning electron microscope image, and an image memory.

The electro-optical lens-barrel 13 is basically configured by an electron source 15, a first condenser lens (C1 lens) 16, a second condenser lens (C2 lens) 17, two stages of scanning deflectors 18, an object lens 21 and the like. As the electron source 15, an electron source of an electric field emitting type is typically used.

The object lens 21 is an object lens of a semi-in-lens type of intentionally permeating in an output magnetic field toward the sample 50 which is arranged downward from a lower face of the lens. There is also a case where the object lens 21 is arranged at an inner portion of the sample chamber 14 in view of a position thereof. However, for convenience of explanation, an explanation will be given such that the object lens 21 is a configuration element which belongs to the electro-optical lens-system barrel 13.

The primary electron beam 3 having an energy equal to or smaller than 200 keV which is emitted from the electron source 15 is converged to a first convergent point 23 by the C1 lens 16, and later passes through an aperture 24. At this time, an unnecessary region of the primary electron beam 3 is removed. A position of the first convergent point 23 of the primary electron beam 3 is controlled by controlling the C1 lens 16.

The primary electron beam 3 which passes through the aperture 24 is converged to a second convergent point 25 by the C2 lens 17. A position of the second convergent point 25 of the primary electron beam 3 is controlled by controlling the C2 lens 17. The primary electron beam 3 which passes through the second convergent point 25 is converged onto the sample 50 by the object lens 21. The two stages of scanning deflectors 18 are arranged between the C2 lens 17 and the object lens 21, and the convergent point on the sample 50 of the primary electron beam 3 is two-dimensionally scanned in accordance with a desired range of field of view/magnification.

Signal electrons of various energies are generated from the sample by an irradiation of the primary electron beam 3. Here, for convenience of explanation, in a case where the sample is at the ground potential, among signal electrons emitted from the sample, a signal electron having an energy equal to or smaller than about 50 eV is particularly referred to as a secondary electron 26. The secondary electron, influenced by a magnetic field produced by the semi-in-lens, passes through a center hole of the object lens 21 by being wound around the optical axis of the primary electron beam and advances in a direction of the electron source. At E×B20 for detector A, the secondary electron 26 is deflected in a direction of a detector A19. The secondary electron 26 is detected by the detector A19. The detector A19 is the same as the electron detector 2 shown in FIG. 1-1. Notation E×B designates an orthogonal electromagnetic field generator that linearly advances the primary electron beam and deflects only an electron of an extremely low energy (<50 eV) to out of axis.

In a band-pass detector, among signal electrons having an energy range of from 1 keV to an irradiation voltage of the primary electron beam, a signal electron having an energy in correspondence with a thickness of a conductive film is detected with emphasis. Similarly to the secondary electron, also the signal electron having the energy range of from 1 keV to the irradiation energy of the primary electron beam is influenced by the magnetic field produced by the semi-in-lens, and a number of the signal electrons pass through the center holes of the object lens 21 by being wound around the optical axis of the primary electron beam and advance in the direction of the electron source.

A conductive film A43 for band-pass detection is configured by an axisymmetric circular disk shape which is provided with a hole for passing the primary electron beam 3 at a center thereof, and is arranged vertically to the optical axis of the primary electron beam 3 at an interval between E×B20 for the detector A and the C2 lens 17. At this time, a thickness of the conductive film A43 is previously determined by an energy which is intended to be subjected to band-pass detection. The extremely low energy electron 6 which is generated by the desired energy electron 5 is detected by a detector B27. The detector B27 is configured similarly to the electron detector 2 shown in FIG. 1-1. E×B30 for a detector B which operates similarly to E×B20 for the detector A may be provided at an interval between the conductive film A43 and the C2 lens 17.

At the detector A19, also an extremely low energy electron 29 which is generated by the low energy electron 4 at the face of the conductive film A43 on the side of the sample can also be detected in addition to the secondary electron 26. In a case where information of the secondary electron 26 is intended to cut by particularly emphasizing only information of the low energy electron, a negative voltage is applied to a shielding electrode 28. The voltage at this time is typically about −100 V. In this case, the secondary electron 26 is pushed back in the direction of the sample by a shielding electric field, and therefore, the low energy electron can be detected by the detector A19.

Second Embodiment

FIG. 3 shows a second embodiment of the present invention, and is a diagram showing a total configuration of a scanning electron microscope including an energy band-pass electron detector. According to the present embodiment, the conductive film A43 that is configured in the axisymmetric circular disk shape provided with the hole of passing the primary electron beam 3 at the center is arranged by an angle equal to or smaller than 150° relative to the optical axis of the primary electron beam 3. According to the method, the extremely low energy electron 6 has an initial speed in a direction of the detector B27, and therefore, the detection is made to be easy without using E×B30 for the detector B explained in the first embodiment. Similarly, when the detector A19 is arranged as shown in FIG. 3, since the extremely low energy electron 29 has an initial speed in the direction of the detector A, and therefore, the detection is made to be easy without using E×B20 for the detector A.

Third Embodiment

Figures 1, 2, 3, 4:
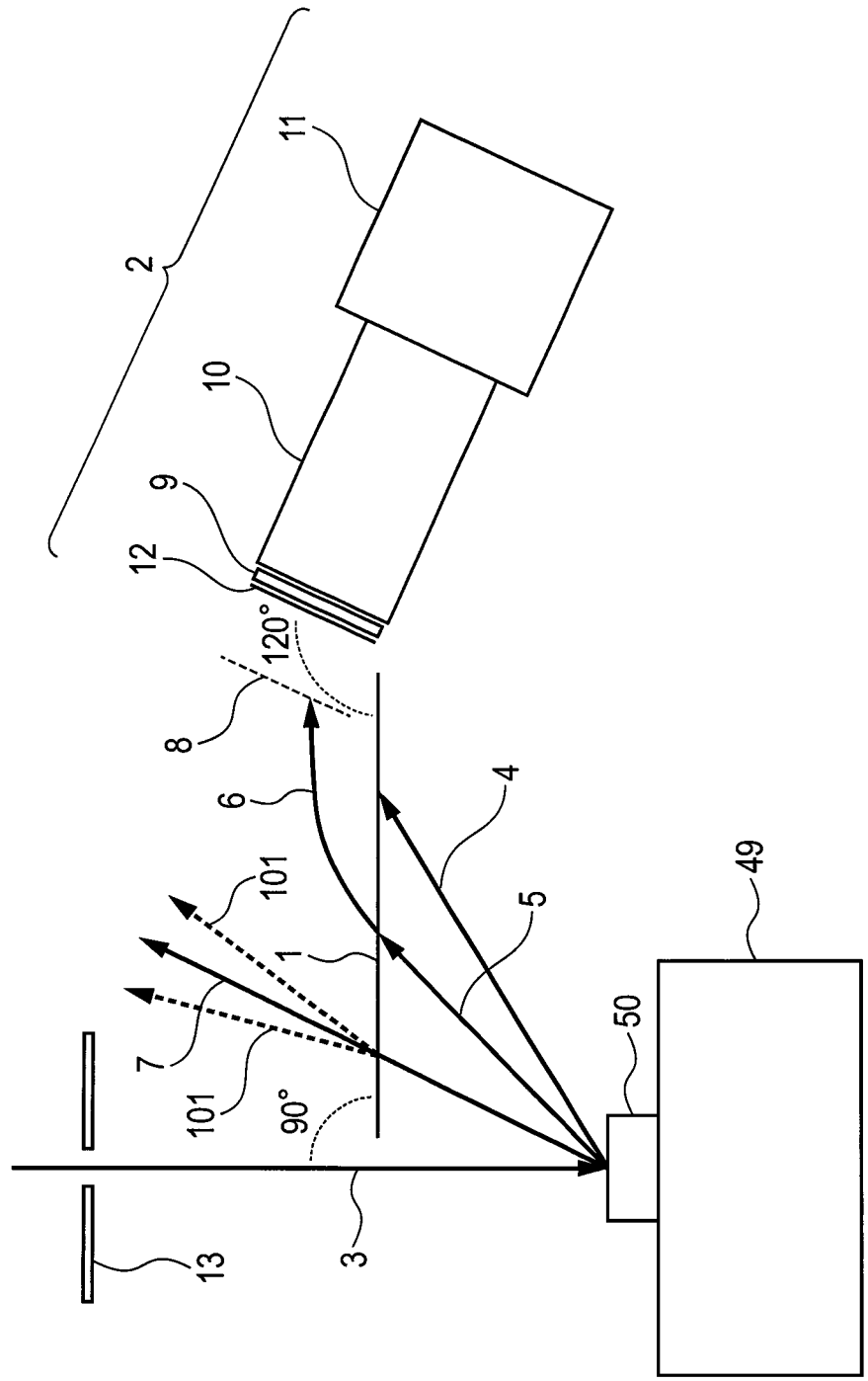
Figure 2:
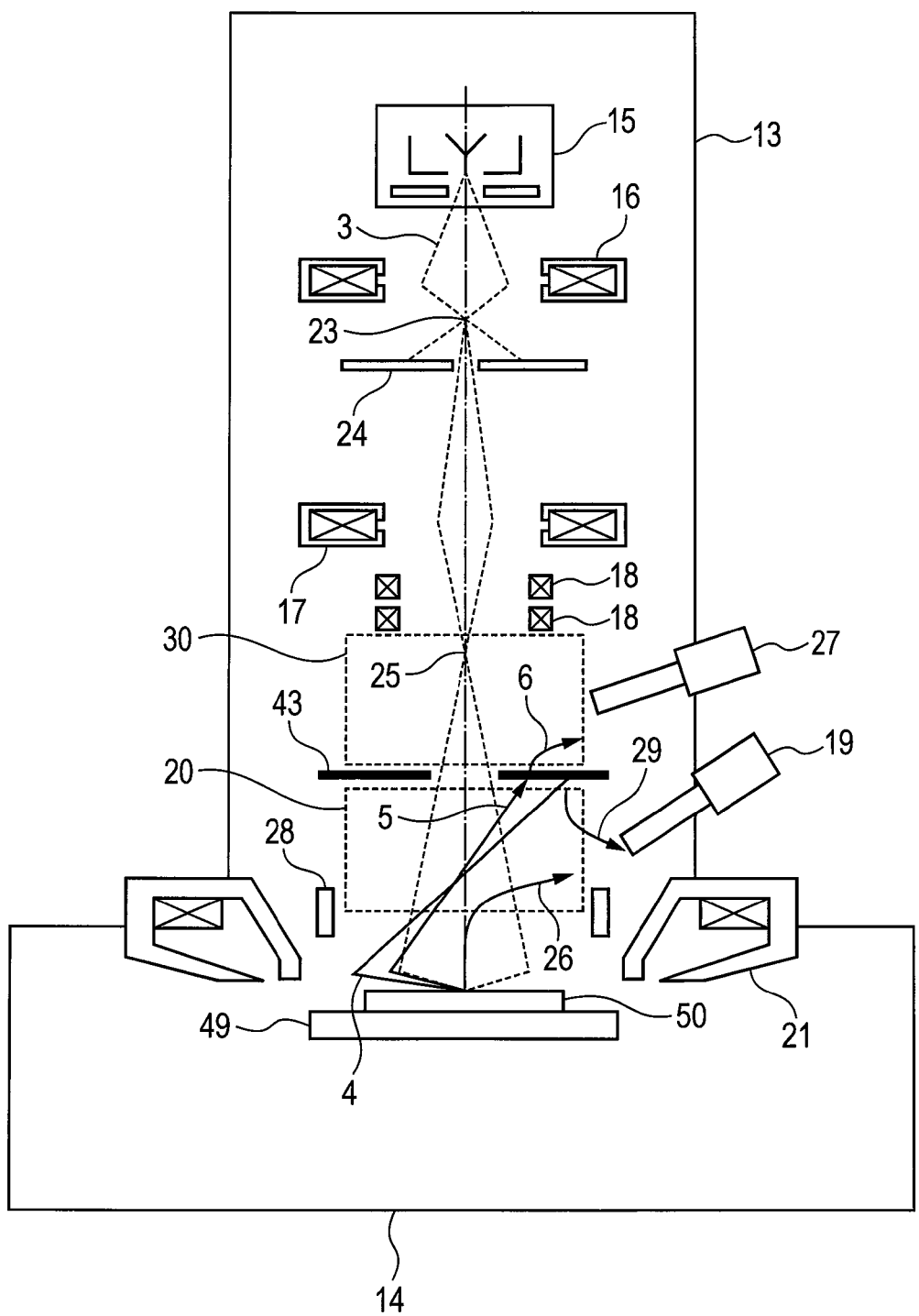
Figure 3:
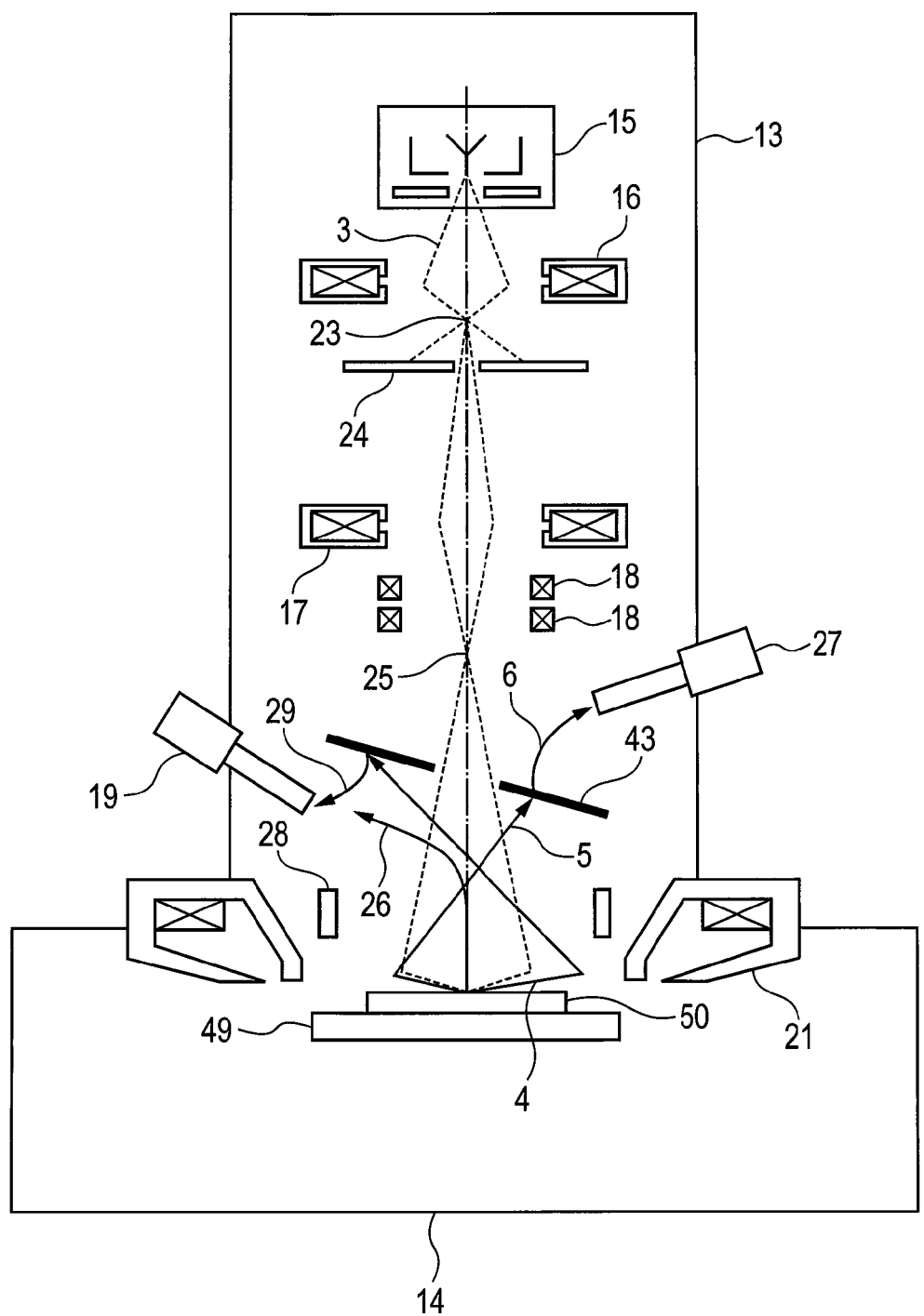
Figure 4:
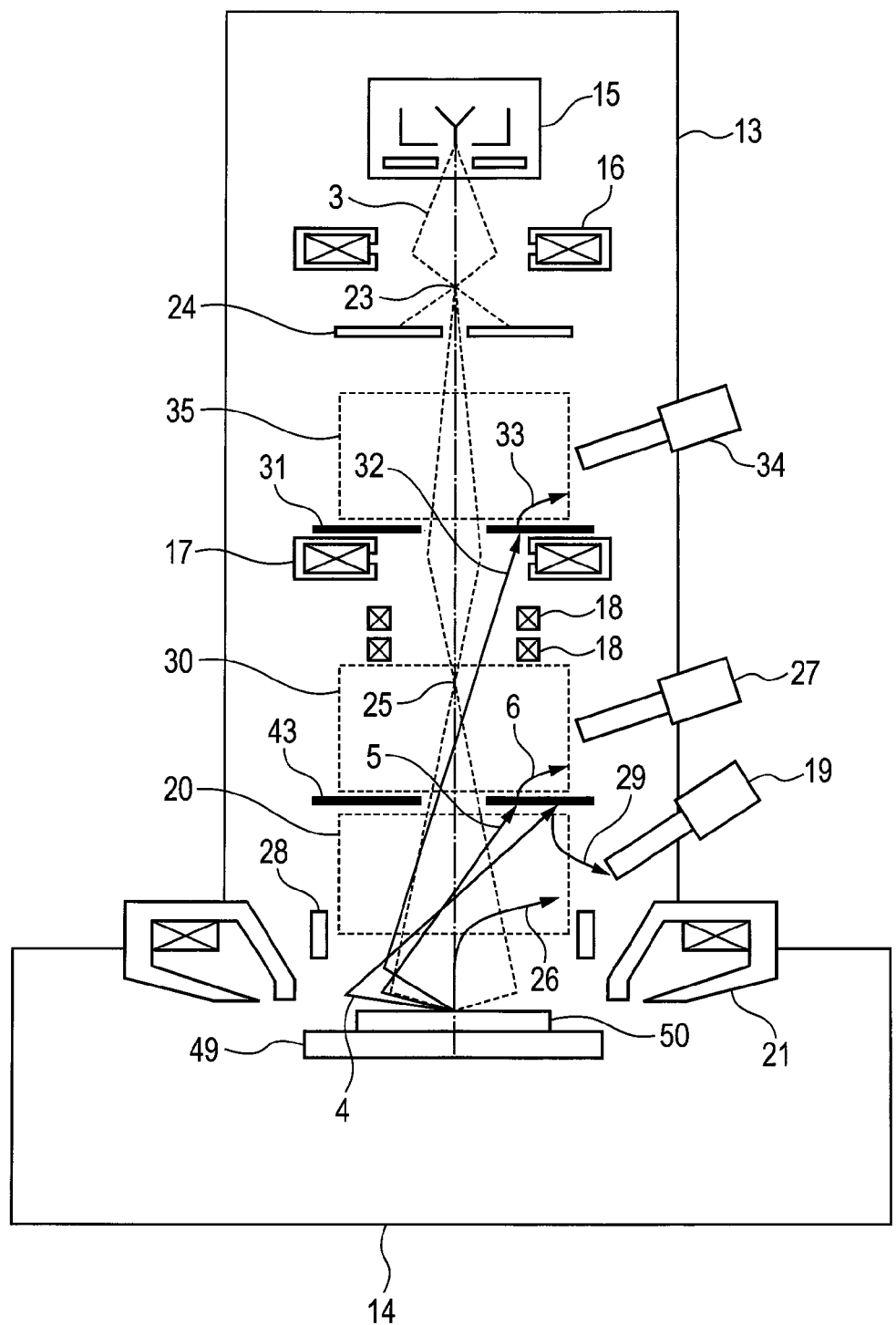

FIG. 4 shows a third embodiment of the present invention and is a diagram showing a total configuration of a scanning electron microscope including an energy band-pass electron detector. According to the present embodiment, particularly in order to detect an electron which is emitted from the sample at a large angle (high angle) (high angle electron), in addition to the first embodiment, one more system of a band-pass detecting system is provided. A conductive film B31 for band-pass detection of the high angle electron is configured by an axisymmetric circular disk shape provided with a hole of passing the primary electron beam 3 at a center thereof, and is arranged vertically to the optical axis of the primary electron beam 3 at an interval between the aperture 24 and the C2 lens 17. At this time, a thickness of the conductive film B31 is determined by an energy which is intended to subject to band-pass detection. The extremely low energy electron 33 which is generated by the high angle electron 32 of a desired energy is detected by a detector C34. The detector C34 is configured similarly to the electron detector 2 shown in FIG. 1-1. E×B35 for the detector C which operates similarly to E×B20 for the detector A may be provided at an interval between the conductive film B31 and the aperture 24.

Incidentally, according to the third embodiment, the detector B24 and E×B30 for the detector B are not necessarily needed. In that case, on the side of the sample of the C2 lens 17, band-pass detection is not carried out, and it is not necessary that the thickness of the conductive film A43 is equal to or less than 50000 nm. Also, the configuration of the side of the sample of the C2 lens 17 may be similar to that in the second embodiment.

Fourth Embodiment

Figure 5:
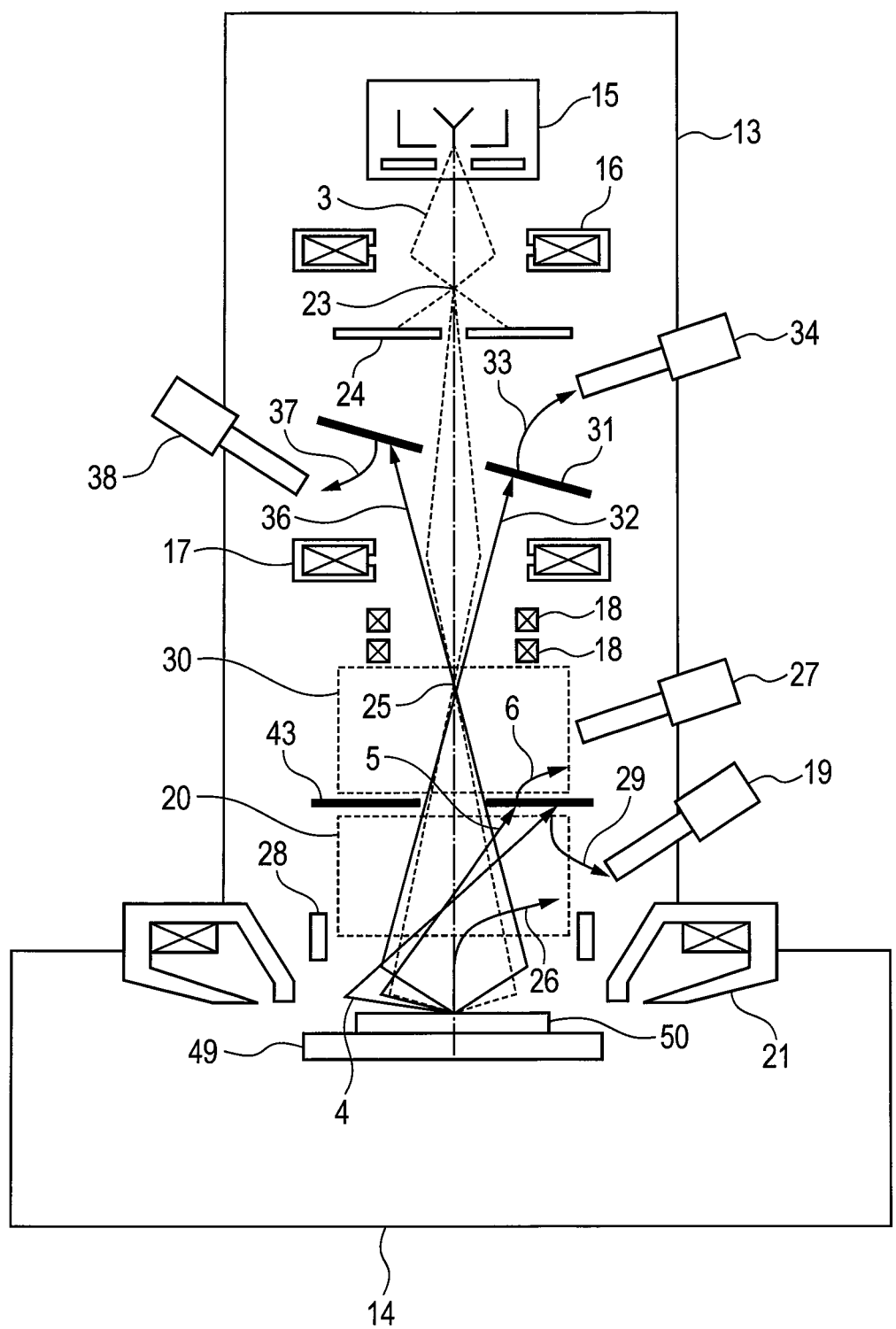
FIG. 5 is a diagram showing a scanning electron microscope according to a fourth embodiment.

FIG. 5 is a diagram showing a fourth embodiment of the present invention and a total configuration of a scanning electron microscope including an energy band-pass electron detector. According to the present embodiment, the conductive film B31 is inclined similarly to the conductive film A43 of the second embodiment. Similarly to the second embodiment, there is provided a detector D38 in order to detect the extremely low energy electron 37 that is generated by a high angle electron 36 of a low energy at a face of the conductive film B31 on the side of the sample.

Incidentally, according to the fourth embodiment, the detector B27 and E×B30 for the detector B are not necessarily needed. In that case, band-pass detection is not carried out under the C2 lens 17, and it is not necessary that the conductive film A43 has a thickness equal to or less than 50000 nm.

Also, a configuration on the sample side of the C2 lens 17 may be similar to that of the second embodiment.

Fifth Embodiment

Figure 6:
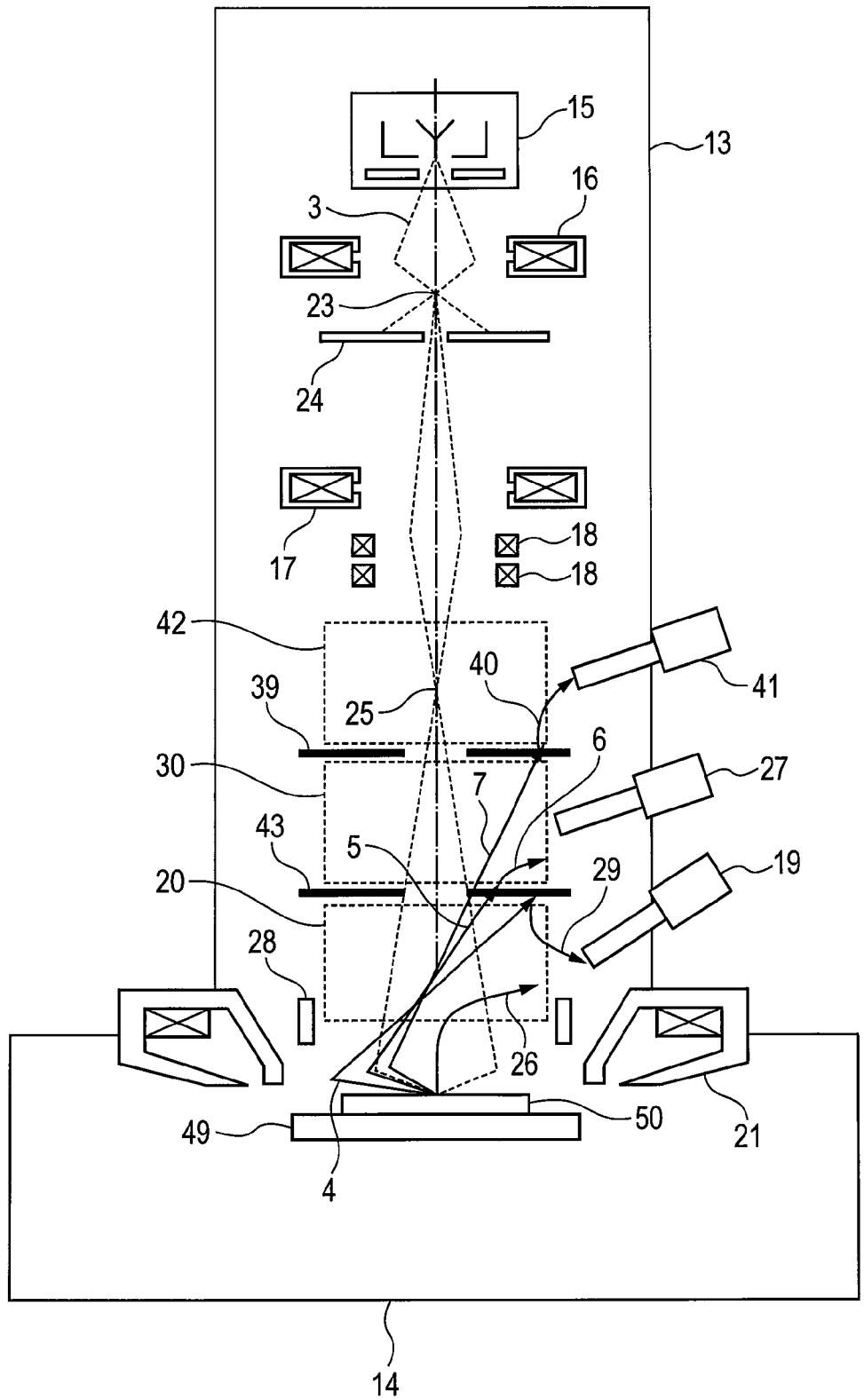
FIG. 6 is a diagram showing a scanning electron microscope according to a fifth embodiment.

FIG. 6 is a diagram showing a fifth embodiment of the present invention and a total configuration of a scanning electron microscope including an energy band-pass electron detector. According to the present embodiment, there is provided one more system of a band-pass detection system in addition to the first embodiment in order to further subject the high energy electron 7 to band-pass detection. A conductive film C39 for band-pass detection is configured in an axisymmetric circular disk shape provided with a hole of passing the primary electron beam 3 at a center thereof and is arranged vertically to the optical axis of the primary electron beam 3 at an interval between the conductive film A43 and the C2 lens 17. At this time, a thickness of the conductive film C39 is determined by an energy of an electron which is intended to be subjected to band-pass detection. An extremely low energy electron 40 which is generated by the high energy electron 7 of a desired energy is detected by a detector E41. The detector E41 is configured similarly to the electron detector 2 shown in FIG. 1-1. E×B42 for the detector E which operates similarly to E×B20 for the detector A may be provided at an interval between the conductive film C39 and the aperture 24.

Sixth Embodiment

Figure 7:
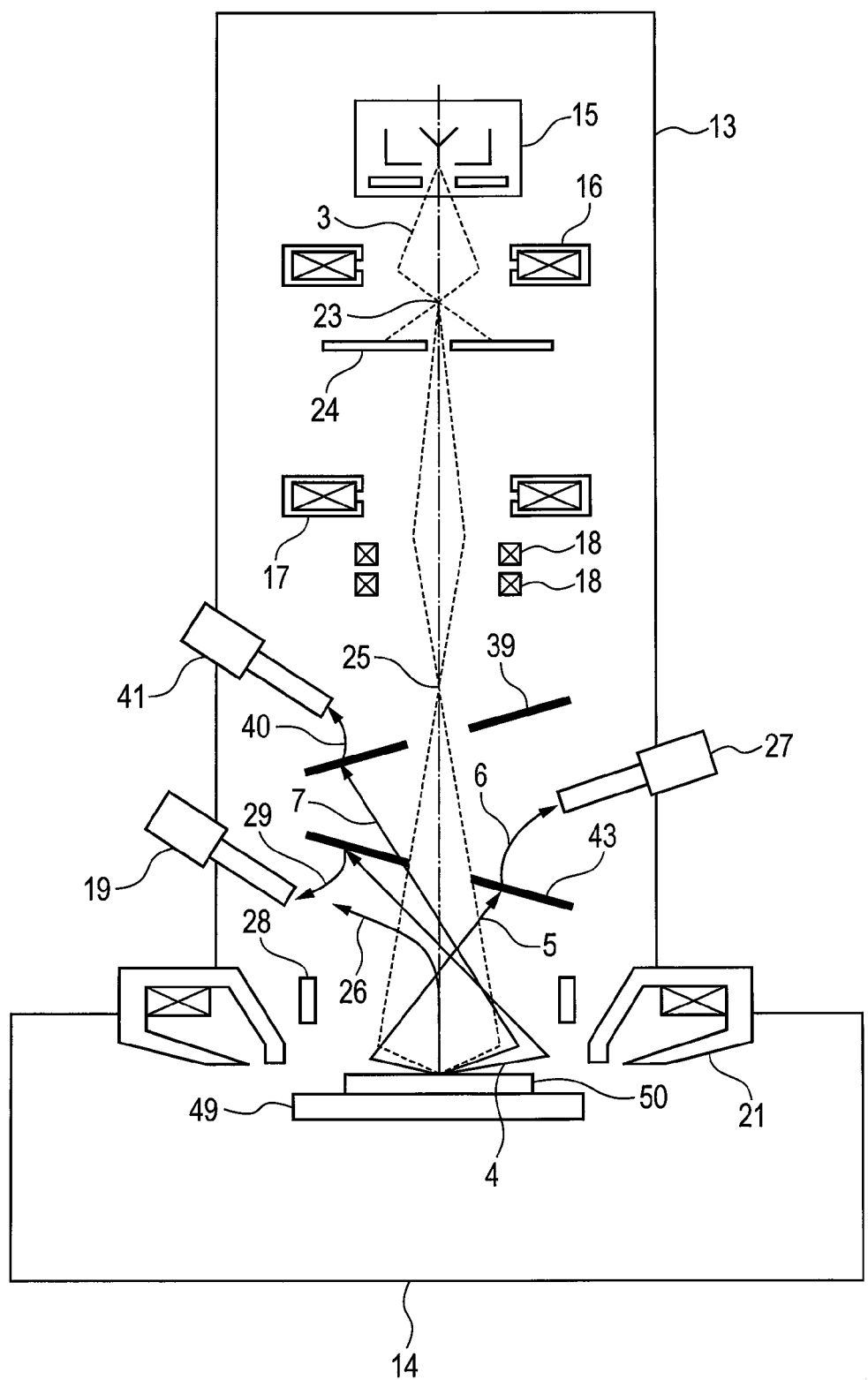
FIG. 7 is a diagram showing a scanning electron microscope according to a sixth embodiment.

FIG. 7 is a diagram showing a sixth embodiment of the present invention and a total configuration of a scanning electron microscope including an energy band-pass electron detector. According to the present embodiment, there is provided one more system of a band-pass detecting system in addition to the second embodiment in order to detect the high energy electron 7. A conductive film C39 for band-pass detection is configured by an axisymmetric circular disk shape provided with a hole of passing the primary electron beam 3 at a center thereof and is arranged at an interval between the conductive film A43 and the C2 lens 17 in a state of being inclined to the optical axis of the primary electron beam 3 by an angle equal to or smaller than 150°. At this time, a thickness of the conductive film C39 is determined by an energy of an electron which is intended to be subjected to band-pass detection. An extremely low energy electron 40 which is generated by the high energy electron 7 of a desired energy is detected by a detector E41. The detector E41 is configured similarly to the electron detector 2 shown in FIG. 1-1.

Configurations 39, 40, 41, and 42 configuring the detecting system for detecting the high energy electron explained in the fifth embodiment may be arranged at an interval between the conductive film B31 (E×B35 for the detector C in a case of providing E×B35 for the detector C) of the third embodiment shown in FIG. 4 and the aperture 24. In that case, the high energy electron of the high angle which passes through the conductive film B31 can be detected.

Also, the configurations 39, 40, and 41 configuring the detecting system for detecting the high energy electron explained in the sixth embodiment may be arranged at an interval between the conductive film B31 of the fourth embodiment shown in FIG. 5 and the aperture 24. In that case, the high energy electron of the high angle which passes through the conductive film B31 can be detected.

Seventh Embodiment

Figure 8:
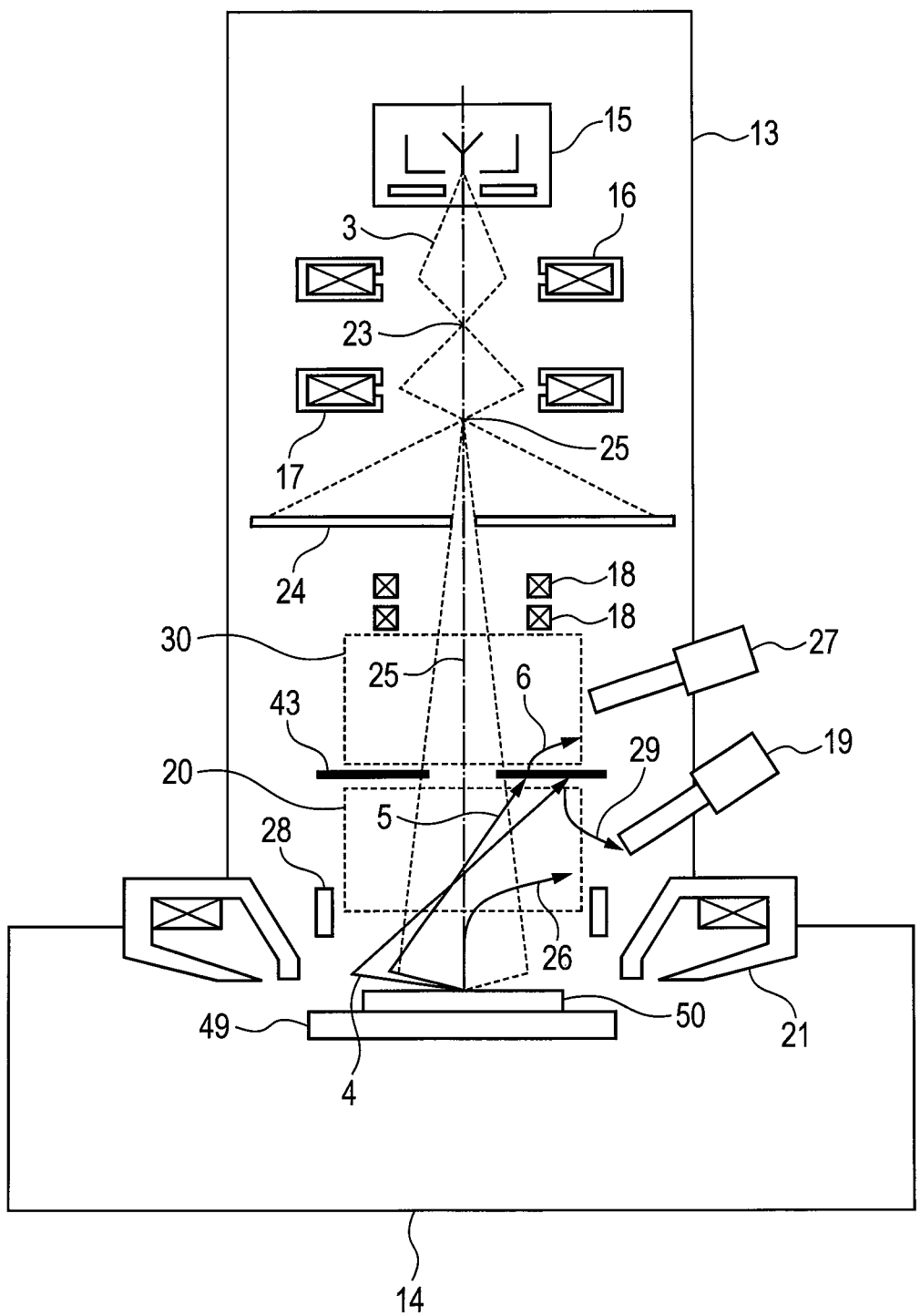
FIG. 8 is a diagram showing a scanning electron microscope according to a seventh embodiment.

FIG. 8 is a diagram showing a seventh embodiment of the present invention and a total configuration of a scanning electron microscope including an energy band-pass electron detector.

In the scanning electron microscope shown in FIG. 8, in comparison with the first embodiment shown in FIG. 2, positions of the aperture 24 and the C12 lens 17 are exchanged. This is an electro-optical lens-barrel which is effective in a case of using an electron source such as a tungsten thermo-electron gun having a large light source diameter while a radiation angle current density is large, and the C1 lens 16 and the C2 lens 17 are used for reducing the primary electron beam 3. The other configuration is similar to that of the first embodiment, and the energy band-pass detection is carried out similarly to the first embodiment. In this case, the conductive film A43 is arranged vertically to the optical axis of the primary electron beam 3 at an interval between E×B20 for the detector A and the aperture 24. Incidentally, similarly also in the scanning electron microscopes from the second embodiment to the sixth embodiment, the lens-barrels may be configured similarly to that of an eighth embodiment.

Eighth Embodiment

Figure 9:
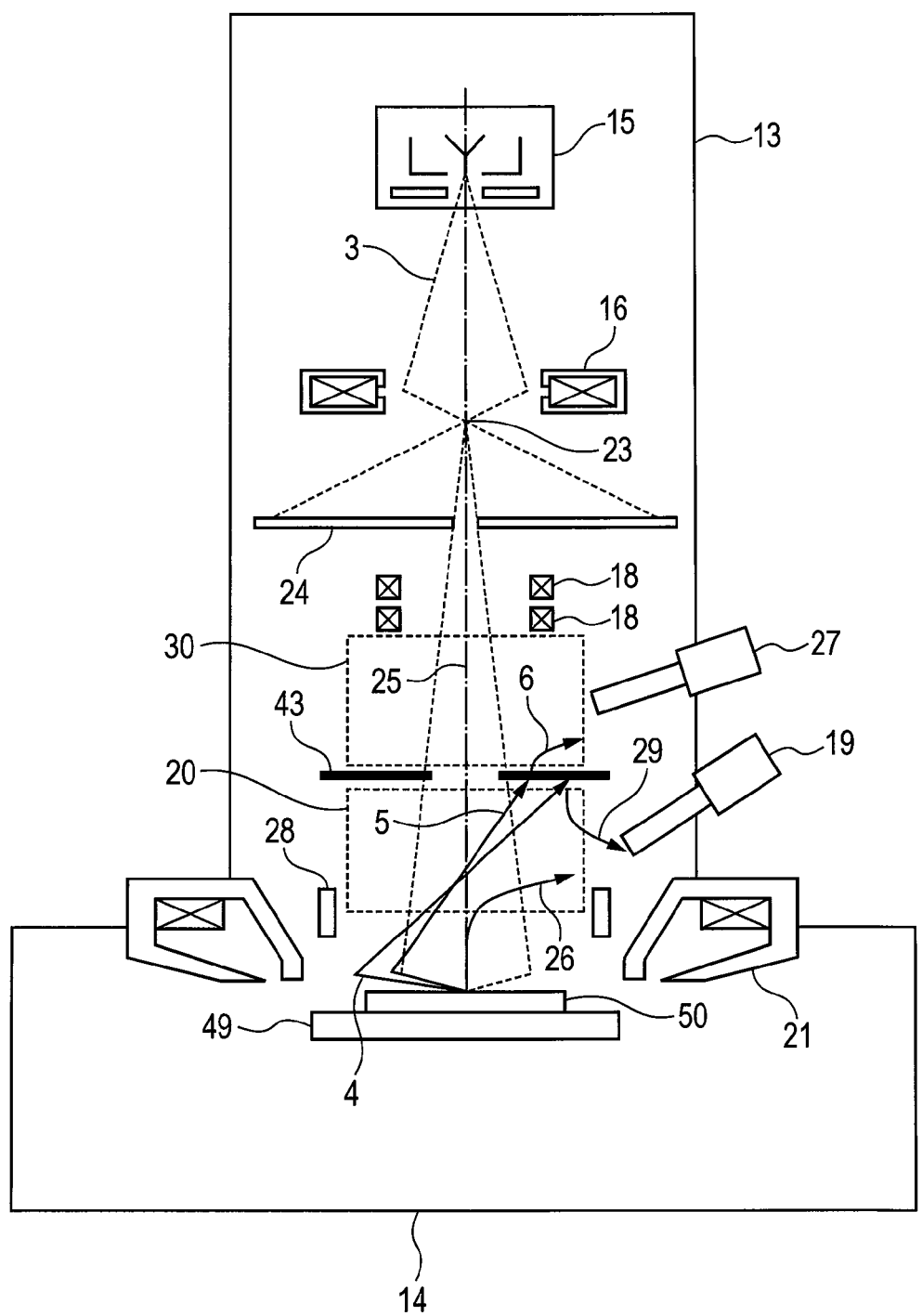
FIG. 9 is a diagram showing a scanning electron microscope according to an eighth embodiment.

FIG. 9 is a diagram showing an eighth embodiment of the present invention and a total configuration of a scanning electron microscope including an energy band-pass electron detector.

The scanning electron microscope shown in FIG. 9 is configured by a shape of eliminating the C2 lens from the seventh embodiment shown in FIG. 8. The scanning electron microscope of the eighth embodiment is featured in being easy to control since one stage of the condenser lens is configured.

However, an electron source of an electric field emitting type having a smaller light source diameter is typically used since a reduction rate of the primary electron beam 3 cannot be made high in comparison with that of the seventh embodiment. The rest of the configuration is similar to that of the first embodiment, and the energy band-pass detection is carried out similarly to the first embodiment. In this case, the conductive film A43 is arranged vertically to the optical axis of the primary electron beam 3 at an interval between E×B20 for the detector A and the aperture 24. Incidentally, similarly also in the scanning electron microscopes from the second embodiment to the sixth embodiment, the lens-barrels may be configured similarly to that of the eighth embodiment.

Ninth Embodiment

Figure 10:
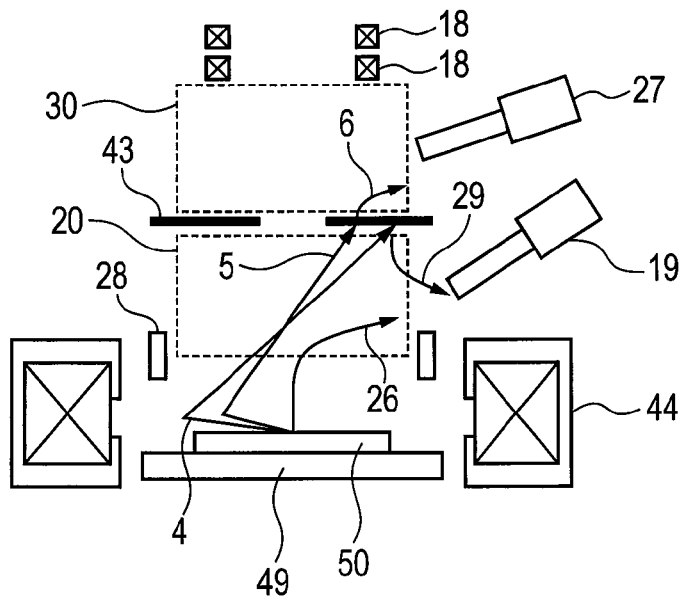
FIG. 10 is a diagram showing a scanning electron microscope according to a ninth embodiment.

FIG. 10 is a diagram showing a ninth embodiment of the present invention and a configuration of a portion of a scanning electron microscope including an energy band-pass electron detector.

In the scanning electron microscope shown in FIG. 10, an object lens thereof differs from that of the first embodiment. The object lens 44 of the ninth embodiment is configured by an in-lens type. According to the style, the sample can be placed in a lens field. Therefore, an observation with a resolution higher than that of the object lens of the semi-in-lens type can be carried out.

The energy band-pass detection is carried out similarly to the first embodiment. Incidentally, similarly also in the scanning electron microscopes from the second embodiment to the eighth embodiment, the object lens may be of the in-lens type.

Tenth Embodiment

Figure 11:
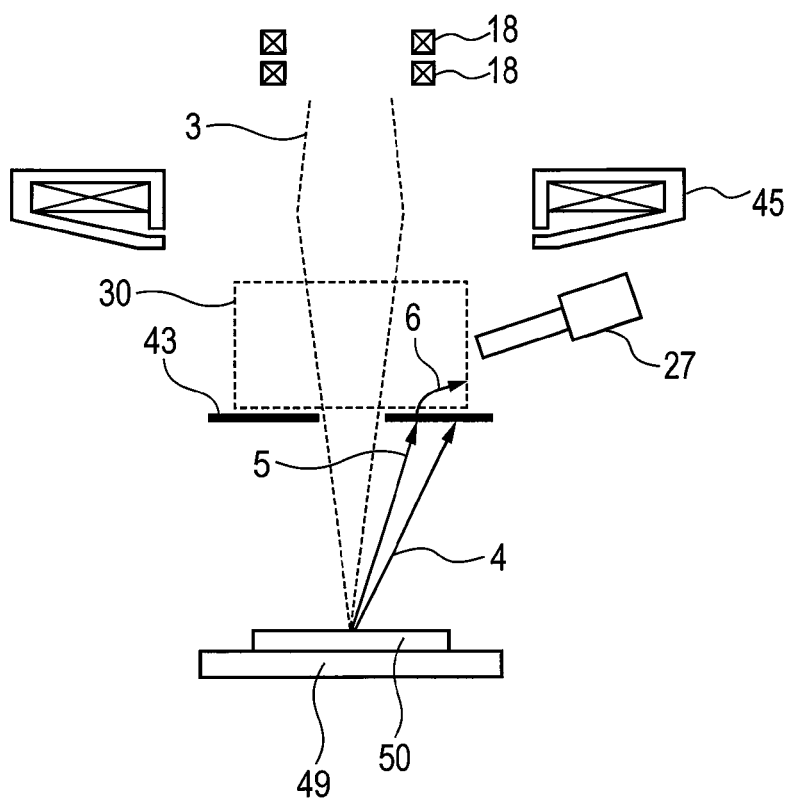
FIG. 11 is a diagram showing a scanning electron microscope according to a tenth embodiment.

FIG. 11 is a diagram showing a tenth embodiment of the present invention and a configuration of a portion of a scanning electron microscope including an energy band-pass electron detector.

In the scanning electron microscope shown in FIG. 11, an object lens thereof differs from that of the first embodiment. An object lens 45 of the tenth embodiment is of out-lens type. According to the style, the sample is exposed to a magnetic field of the object lens 45, and therefore, an observation of a magnetic material sample or the like can be carried out.

According to the tenth embodiment, unlike the previous embodiments, the sample is not placed in a magnetic field. Therefore, a number of signal electrons having an energy width from 1 keV to the irradiation energy of the primary electron beam configuring the object of the band-pass detection linearly advance. Hence, according to the tenth embodiment, a band-pass detection system is provided on the sample side of the object lens. The configuration of the tenth band-pass detection system is the same as the configuration of FIG. 1-1.

However, the conductive film A43 is configured by an axisymmetric circular disk shape provided with a hole of passing the primary electron beam 3 at a center thereof, and arranged vertically to the optical system of the primary electron beam 3 at an interval between the object lens and the sample 50. The energy band-pass detection is carried out similarly to the first embodiment. However, according to the tenth embodiment, a structure does not exist at a route of a signal electron at an interval between the conductive film A43 and the sample.

Eleventh Embodiment

Figure 12:
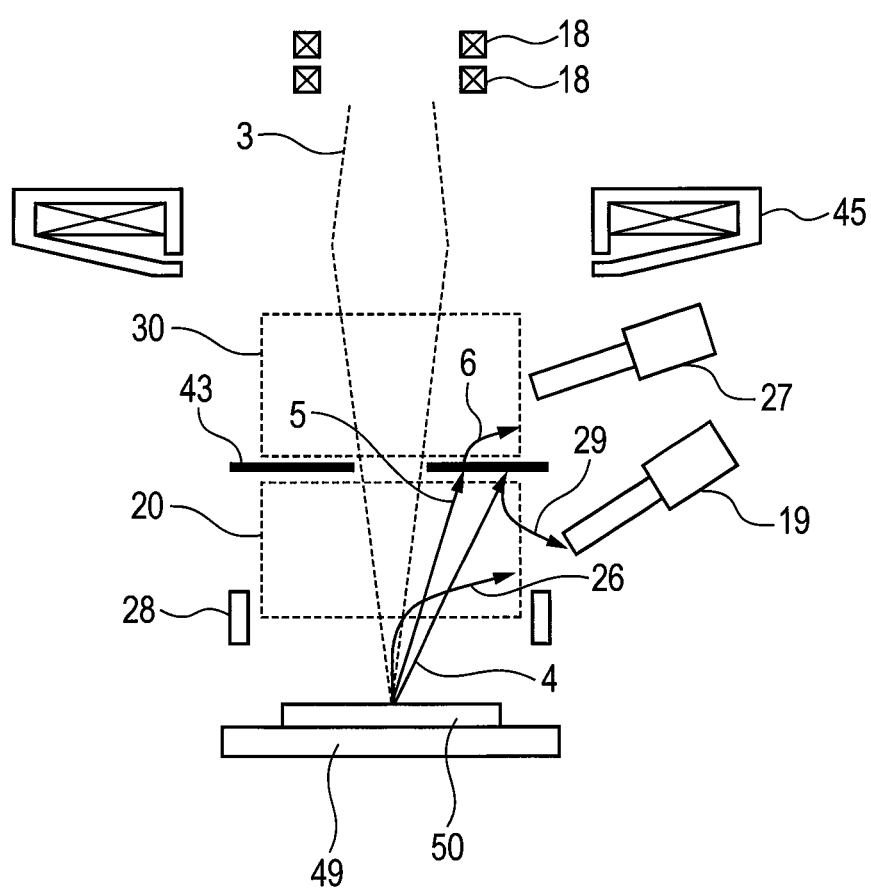
FIG. 12 is a diagram showing a scanning electron microscope according to an eleventh embodiment.

FIG. 12 is a diagram showing an eleventh embodiment of the present invention and a configuration of a portion of a scanning electron microscope provided with an energy band-pass electron detector.

In the scanning electron microscope shown in FIG. 12, a configuration of an energy band-pass electron detector differs from that of the tenth embodiment. The configuration of the energy band-pass electron detector of the tenth embodiment is configured such that the configuration of the first embodiment from E×B30 for the detector B to the accelerating electrode 28 is arranged at an interval between the object lens 45 and the sample 50. The energy band-pass detection is carried out similarly to that of the first embodiment.

Twelfth Embodiment

Figure 13:
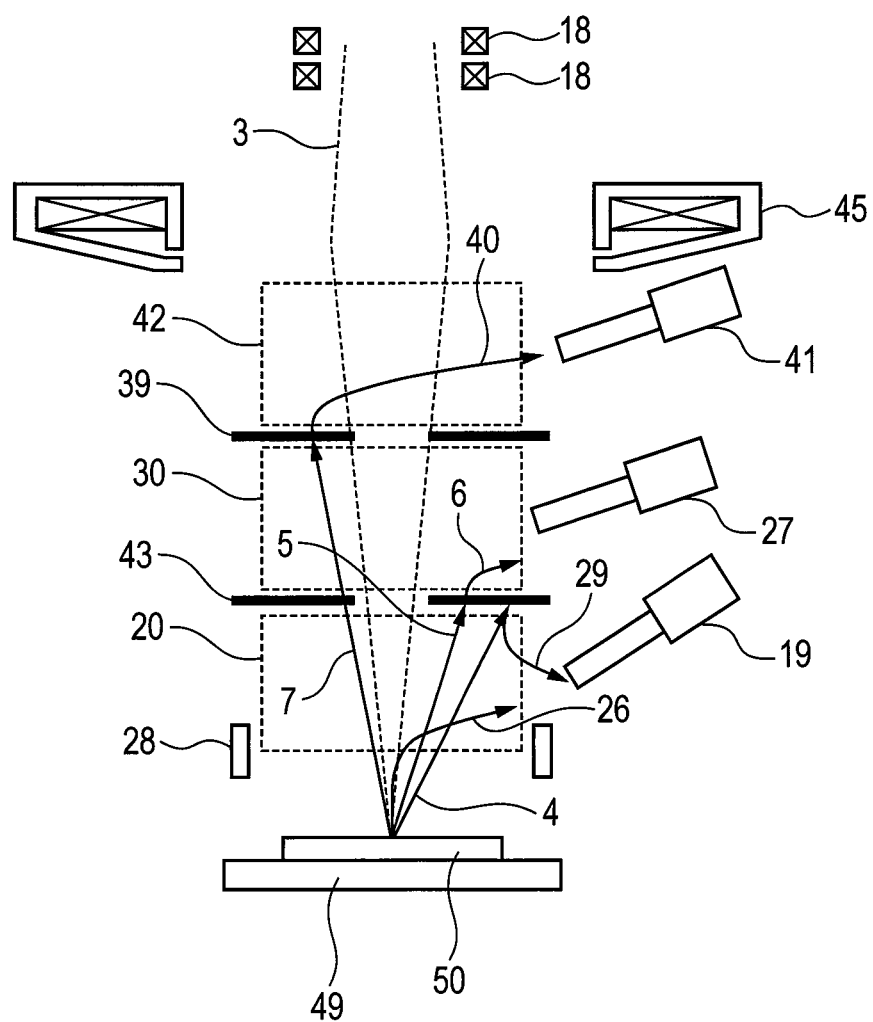
FIG. 13 is a diagram showing a scanning electron microscope according to a twelfth embodiment.

FIG. 13 is a diagram showing a twelfth embodiment of the present invention and a configuration of a portion of a scanning electron microscope provided with an energy band-pass electron detector.

In the scanning electron microscope shown in FIG. 13, a configuration of an energy band-pass electron detector differs from that of the tenth embodiment. The configuration of the energy band-pass electron detector of the tenth embodiment is configured such that a configuration of the fifth embodiment from E×B42 for the detector E to the accelerating electrode 28 is arranged at an interval between the object lens 45 and the sample 50. The energy band-pass detection is carried out similarly to that of the fifth embodiment.

Thirteenth Embodiment

Figure 14:
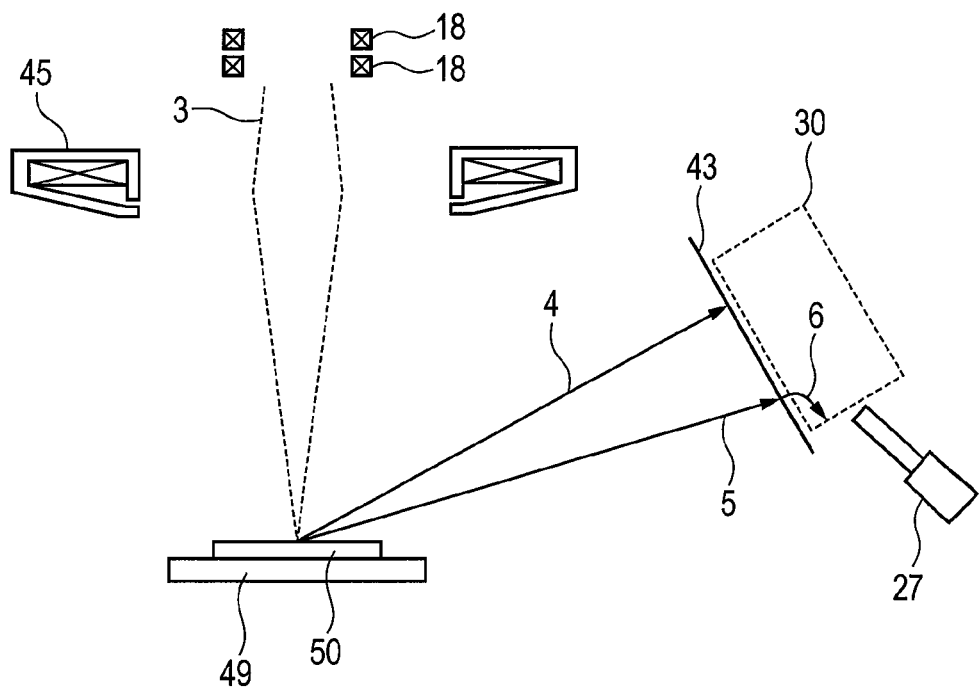
FIG. 14 is a diagram showing scanning electron microscope according to a thirteenth embodiment.

FIG. 14 is a diagram showing a thirteenth embodiment of the present invention and a configuration of a portion of a scanning electrode microscope provided with an energy band-pass electron detector.

The scanning electron microscope shown in FIG. 14 differs from the tenth embodiment in an arrangement of an energy band-pass electron detector. In the thirteenth embodiment, the conductive film A43 and the detector C27 are arranged at out of axis. An angle between the sample and the conductive film A43 falls in a range of 0° through 90°. The detector C27 is arranged at a position at which a distance between the detector C27 and the sample is larger than a distance between a face of the conductive film A43 to which the signal electron is impacted and the sample. According to the method, the conductive film A43 may not have a center hole. The energy band-pass detection is carried out similarly to that of the tenth embodiment.

Also respective configuring elements of the energy band-pass electron detector which are provided at an interval from the object lens 45 to the sample 50 according to the eleventh embodiment and the twelfth embodiment may be arranged at outside of axis similarly to the thirteenth embodiment. In that case, the conductive film A43 and the conductive film C39 may not have center holes. Also, the conductive film A43 and the conductive film C39 may not be in parallel with each other. However, a distance between the sample 50 and the detector C27 needs to be larger than a distance between the sample 50 and the conductive film A43 and a distance between the sample 50 and the detector E41 needs to be larger than a distance between the sample 50 and the conductive film C39, respectively.

Figure 15:
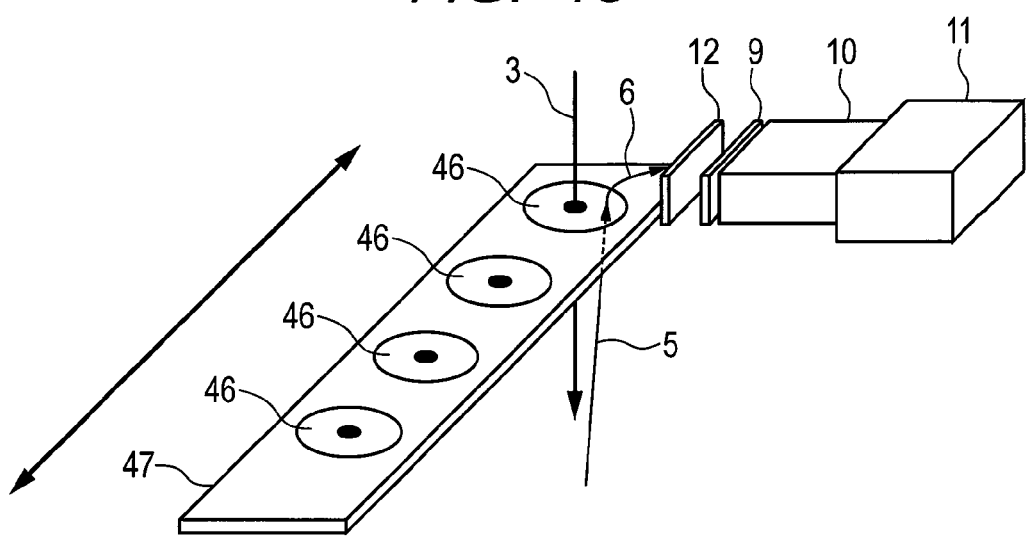
FIG. 15 is a diagram showing a mechanism of making a band-pass detection energy variable in a band-pass detector according to the present invention.

FIG. 15 shows a mechanism of making an energy for band-pass detection variable in a scanning electron microscope according to the present invention.

Plural conductive films having different thicknesses are arranged at a holder 47 attached with a linear guide. The holder 47 is arranged vertically to the primary electron beam 3 and can be traversed by the linear guide (not illustrated) to a state in which the primary electron beam 3 passes through center holes of the respective conductive films 46. The thicknesses of the respective conductive films differ from each other, and therefore, a user can select the film thickness by an energy by which the band-pass detection is intended to carry out. A detector that detects the extremely low energy electron 6 to which the desired energy electron 4 is transformed is similar to that of FIG. 1-1. Any of the conductive film A43, the conductive film B31, and the conductive film C39 shown in the first through thirteenth embodiments may be provided with the mechanism for making the energy variable shown here.

Figure 16:
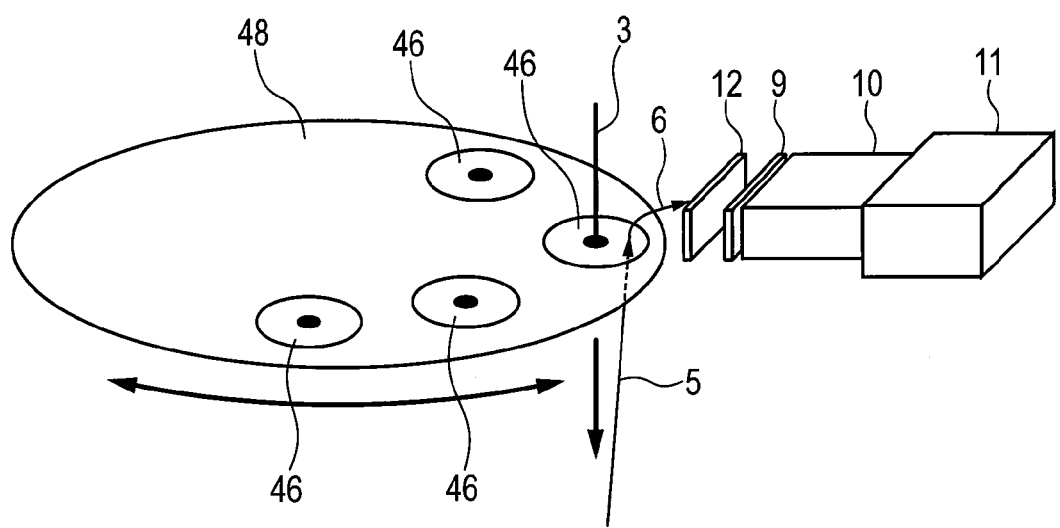
FIG. 16 is a diagram showing a second mechanism for making a band-pass detection energy variable in a band-pass detector according to the present invention.

FIG. 16 shows an embodiment of a mechanism of making an energy for band-pass detection variable separately from that of the fourteenth embodiment in a scanning electron microscope according to the present invention.

The plural conductive films 46 having the different thicknesses are arranged at a holder 48 in a circular disk or fan shape. The holder 48 is arranged vertically to the primary electron beam 3 and can be rotated such that the center holes of the respective conductive films 46 are arranged in the state of passing primary electron beam 3 therethrough by a rotating mechanism (not illustrated).

A user can select the film thickness by the energy by which the band-pass detection is intended to carry out since the thicknesses of the conductive films differ from each other. A detector which detects the extremely low energy electron 6 to which the electron 4 of a desired energy is transformed is similar to that of FIG. 1-1. Any of the conductive film A43, the conductive film B31, and the conductive film C39 shown in the first through the thirteenth embodiment may be provided with the mechanism of making the energy variable shown here.

In all of the embodiments described above, there is a possibility of depositing contamination by impinging the electron beam in the conductive film A43, the conductive film B31, and the conductive film C39. In order to restrain the deposition of contamination, the respective conductive films may be maintained at 200° C. or lower. In all of the embodiments described above, means for preventing overheating of the conductive film may be provided.

In the scanning electron microscope including plural detectors in the embodiment described above, there may be provided calculating means of obtaining one signal from plural signals obtained from the separate detectors. For example, in the fifth embodiment shown in FIG. 6, a signal obtained by the detector B27 is a signal which depends on an intensity of a desired energy. When a signal of the high energy electron obtained at the detector C41 is subtracted from the signal, there can be subtracted information of the high energy electron which has a possibility of being mixed to the detector B27 even by a small amount.

Although all of the embodiments described above relate to a scanning electron microscope, the present invention is not limited to a scanning electron microscope. For example, in a transmission electron microscope, when the detector of the present invention is arranged on a side of an electron gun of a sample, energy band-pass detection with regard to an electron which is generated on the side of the electron gun of the sample can be carried out simultaneously with observation of a transmitted electron image. In a scanning transmission electron microscope, when the detector of the present invention is arranged on a side of an electron gun of a sample, there can be obtained an energy band-pass image with regard to an electron which is generated on the side of the electron gun of the sample simultaneously with observation of a scanned transmitted electron image.

Fourteenth Embodiment

Figure 17:
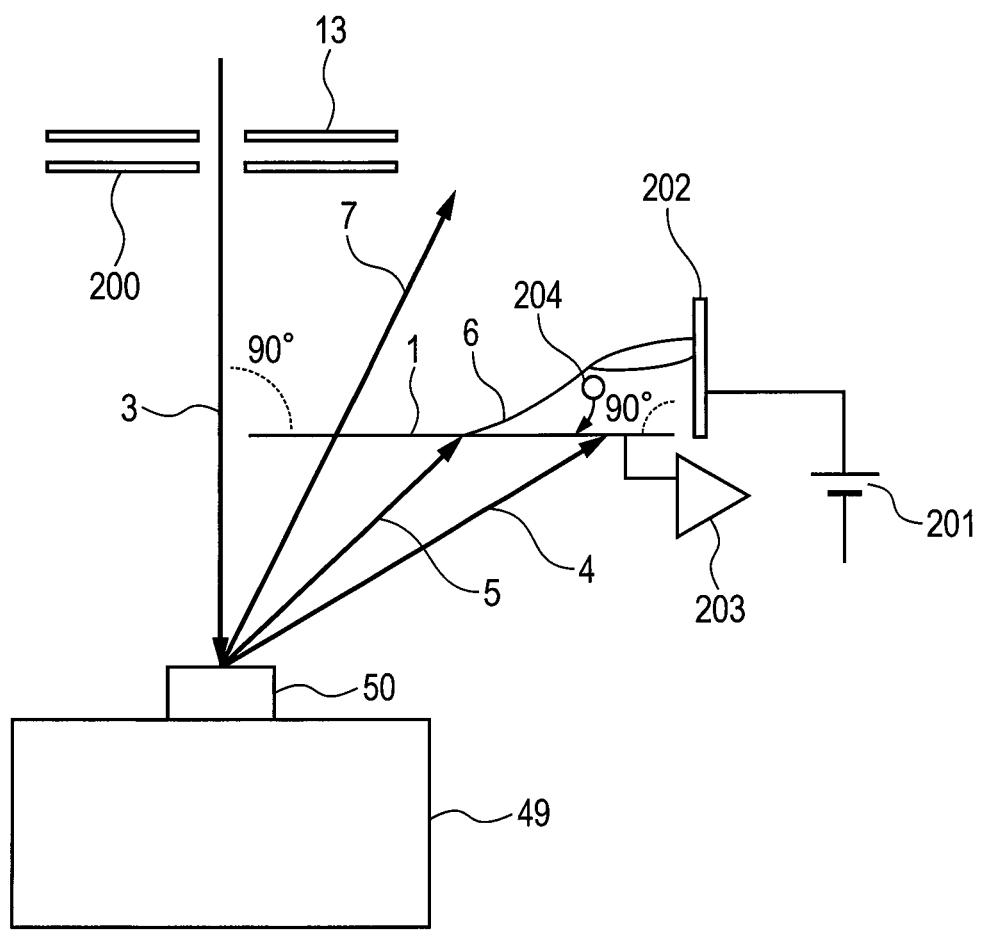
FIG. 17 is a diagram showing a low vacuum scanning electron microscope according to a fourteenth embodiment.

FIG. 17 is a diagram showing a fourteenth embodiment of the present invention and a configuration of a portion of a scanning electron microscope provided with an energy band-pass electron detector.

The scanning electron microscope shown in FIG. 17 is a low vacuum scanning electron microscope in which the inside of a sample chamber is maintained typically at low vacuum of 10 through 1000 Pa. In the low vacuum scanning electron microscope, the inside of the sample chamber is maintained at 10 through 100 Pa by a vacuum discharge system (not illustrated). An upstream side of the electro-optical lens-barrel 13 needs to be maintained in high vacuum more than 0.1 Pa in order to reduce influence of scattering the primary electron beam by a low vacuum atmosphere. A differential discharge orifice 200 is provided at an interval between the electro-optical lens-barrel 13 and the sample chamber for that purpose.

In the scanning electron microscope shown in FIG. 17, the electron detector portion differs from those of the embodiments of FIGS. 1-1 through 14. The detector of the present embodiment includes an electric field supplying electrode 202 for applying a positive voltage of 100 through 500 V, a power source for electric field supplying electrode 201, and a current amplifier 203 which is electrically connected to the conductive film 1. The electric supplying electrode 202 in correspondence with a sensing surface of the detector is an electrode in a plate-like or mesh-like shape, and is arranged to the conductive film 1 with an angle of 90° therebetween. Although the conductive film 1 is maintained at a potential which is lower than that of the electric supplying electrode 202, generally, the potential of the electric supplying electrode is the ground potential.

The energy band-pass electron detector is realized by such a configuration even in the low vacuum scanning electron microscope.

According to the present embodiment, the desired energy electron 5 is detected as follows under the low vacuum atmosphere.

The desired energy electron 5 generates the extremely low energy (several eV) electron 6 from a face of the conductive film 1 opposed to the sample 50 similarly to the electron described in the above-described embodiments. The extremely low energy electron 6 is accelerated in a direction of the electric field supplying electrode 202 by an electric field supplied by the electric field supplying electrode 202. At this time, the extremely low energy electron 6 is scattered along with a gas molecule of the low vacuum atmosphere and ionizes the gas molecule with a constant probability. An ion 204 generated thereby moves toward the conductive film 1 a potential of which is lower than that of the electric field supplying electrode 202. As a result thereof, a displacement current flows in the current amplifier 203 connected to the conductive film 1 that is caused by the movement of the extremely low energy electron 6 and the movement of the ion 204. The displacement current is in proportion to an amount of generating the extremely low energy electron 6, and therefore, an amount of generating the desired energy electron 5. A scanning electron microscope image with the desired energy electron 5 as a source of a signal is obtained by amplifying the displacement current by the current amplifier 203.

The angle between the conductive film 1 and the electric field supplying electrode 202 is not limited to 90°. Similarly to the embodiments shown in FIG. 1-2, FIG. 1-3, and FIG. 1-4, there may be a variation in the arrangement. Effects of the respective variations are similar to those described in the above-described embodiments.

Fifteenth Embodiment

Figure 18:
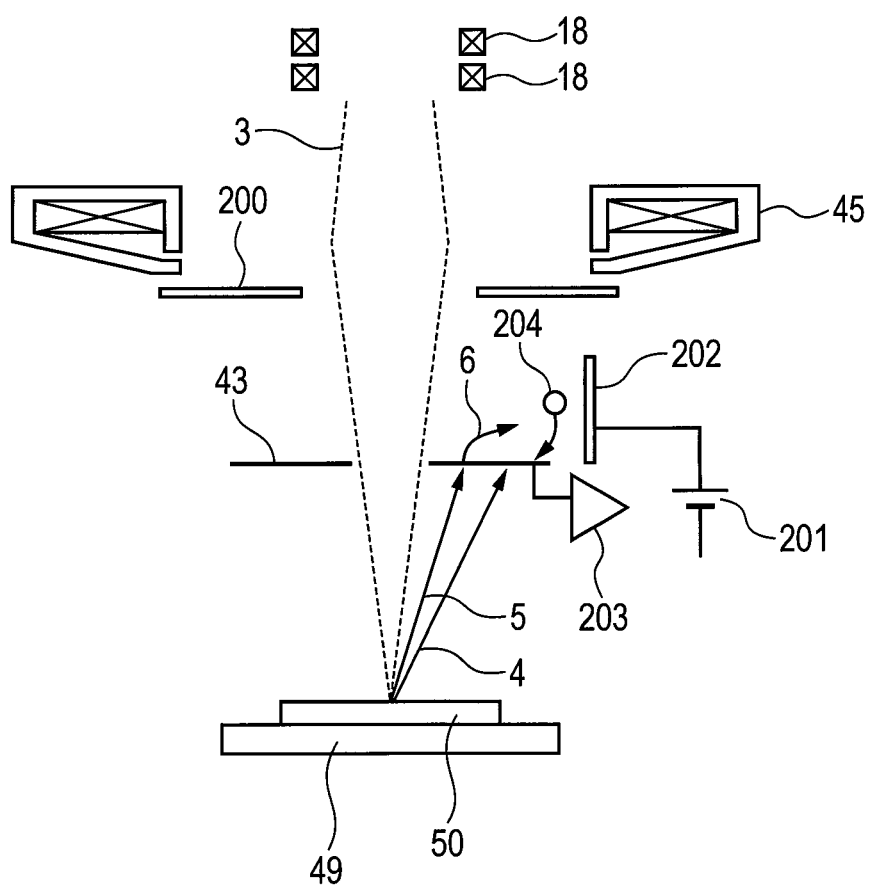
FIG. 18 is a diagram showing a low vacuum scanning electron microscope according to a fifteenth embodiment.

FIG. 18 shows a fifteenth embodiment of the present invention and is another mode of the embodiment of FIG. 17. The embodiment of FIG. 18 is a low vacuum scanning electron microscope similar to the embodiment of FIG. 17 and has a mode excluding E×B30, and the detector B27 from the tenth embodiment shown in FIG. 11 and with the addition of a vacuum discharge system which brings a sample chamber (not illustrated) under low vacuum, the differential discharge orifice 200, the power source for electric field supplying electrode 201, the electric field supplying electrode 202, and the current amplifier 203 electrically connected to the conductive film 1.

The detection principle is similar to that of the embodiment of FIG. 17, and a detection three-dimensional angle can be enlarged by such a configuration.

Sixteenth Embodiment

Figure 19:
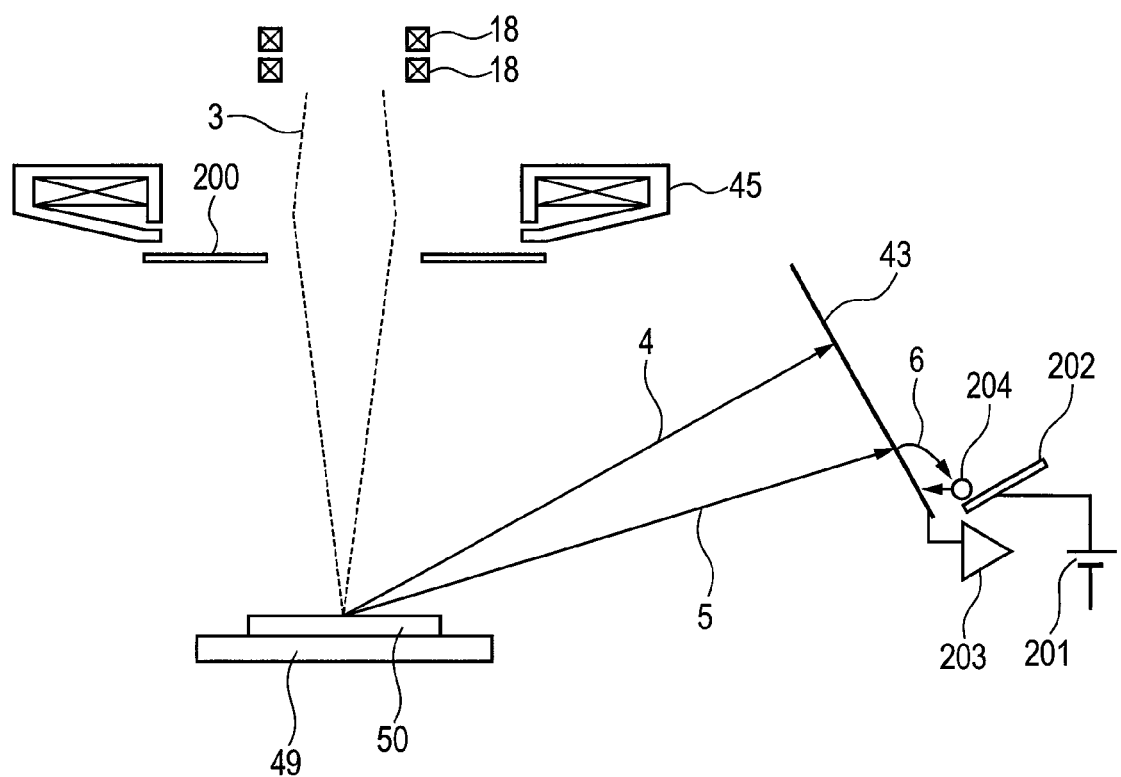
FIG. 19 is a diagram showing a low vacuum scanning electron microscope according to a sixteenth embodiment.

FIG. 19 shows a sixteenth embodiment of the present invention and another mode of the embodiment of FIG. 17. The embodiment of FIG. 19 is a low vacuum scanning electron microscope similar to the embodiment of FIG. 17, and is configured by a mode excluding E×B30 and the detector B27 from the thirteenth embodiment shown in FIG. 14, and with the addition of a vacuum discharge system of bringing a sample chamber (not illustrated) under low vacuum, the differential discharge orifice 200, the power source for the electric field supplying electrode 201, the electric field supplying electrode 202, and the current amplifier 203 electrically connected to the conductive film 1.

The detection principle is similar to that of the embodiment of FIG. 17, and a space just above the sample can be given to another detector by such a configuration.

In the fourteenth to sixteenth embodiments of FIG. 17 through FIG. 19, the current amplifier 203 may be connected to the electric supplying electrode 202. In this case, although a polarity of the obtained signal current is inverted to that of the case of connecting the current amplifier 203 to the conductive film 1, a value thereof stays substantially the same. In this case, a floating mechanism is needed for the current amplifier 203. In this case, there is achieved an advantage that it is not necessary to reconnect the current amplifier 203 when the thickness of the conductive film is changed.

LIST OF REFERENCE SIGNS

1 . . . conductive film, 2 . . . electron detector, 3 . . . primary electron beam, 4 . . . low energy electron, 5 . . . desired energy electron, 6 . . . extremely low energy (several eV) electron, 7 . . . high energy electron, 8 . . . mesh electrode, 9 . . . scintillator, 10 . . . light guide, 11 . . . photomultiplier, 12 . . . accelerating electrode, 13 . . . electro-optical lens-barrel, 14 . . . sample chamber, 15 . . . electron source, 16 . . . C1 lens, 17 . . . C2 lens, 18 . . . two stages of scanning deflectors, 19 . . . detector A, 20 . . . E×B for detector A, 21 . . . semi-in lens type object lens, 23 . . . first convergent point of primary electron beam, 24 . . . aperture, 25 . . . second convergent point of primary electron beam, 26 . . . secondary electron, 27 . . . detector B, 28 . . . shielding electrode B, 29 . . . extremely low energy electron originated from low energy electron, 30 . . . E×B for detector B, 31 . . . conductive film B, 32 . . . desired energy high angle electron, 33 . . . extremely low energy electron originated from desired energy high angle electron, 34 . . . detector C, 35 . . . E×B for detector C, 36 . . . low energy high angle electron, 37 . . . extremely low energy electron originated from low energy high angle electron, 38 . . . detector D, 39 . . . conductive film C, 40 . . . extremely low energy electron originated from high energy electron, 41 . . . detector E, 42 . . . E×B for detector E, 43 . . . conductive film A, 44 . . . in-lens type object lens, 45 . . . out-lens type object lens, 46 . . . plural conductive films of different thicknesses, 47 . . . holder of plural conductive films of different thicknesses, 48 . . . circular disk or fan-shaped holder of plural conductive films of different thickness, 49 . . . sample base, 50 . . . sample, 101 . . . trajectory of high energy electron after passing conductive film 1, 200 . . . differential discharge orifice, 201 . . . power source for electric field supplying electrode, 202 . . . electric field supplying electrode, 203 . . . current amplifier, 204 . . . ion

The invention claimed is:

1. A charged particle radiation device, comprising:
a charged particle source which generates a primary charged particle beam as a probe;
a charged particle optical system;
a sample stage having a sample provided thereon;
a vacuum discharge system;
an aperture which restricts a probe;
a conductive film having a thickness; and
a charged particle detector,
wherein secondary charged particles are generated from the sample by irradiating the sample with the primary charged particle beam,
wherein secondary charged particles, transmitted from the conductive film opposite to the sample are detected by the charged particle detector,
wherein the conductive film is provided at a position between the sample stage and the aperture, except within a path of the primary charged particle beam, and
wherein a distance between a sensing surface of the charged particle detector and the sample stage is greater than a distance between the sample stage and the conductive film,
wherein the surface of the conductive film and the sensing surface of the detector are inclined with respect to each other, and wherein the thickness of the conductive film and the angle of inclination of the surface of the conductive film relative to the sensing surface of the detector allows for band-pass detection of only secondary charged particles having an energy within a predetermined range having a lower limit and an upper limit.

2. The charged particle radiation device according to claim 1, wherein the conductive film is arranged substantially perpendicular to an optical axis of the primary charged particle beam within +/−10 degrees, and an angle between the conductive film and the sensing surface of the detector falls in a range of 30 to 150 degrees.

3. The charged particle radiation device according to claim 1, wherein the conductive film is arranged relative to the optical axis of the primary charged particle beam within an angle of 100 to 150 degrees therebetween, and an angle between the conductive film and the sensing surface of the detector falls in a range of 30 to 150 degrees.

4. The charged particle radiation device according to claim 1, wherein a thickness of the conductive film falls in a range of 10 to 50000 nm.

5. A charged particle radiation device, wherein the charged particle radiation device according to claim 1 is a scanning electron microscope, further comprising means for supplying an electric field or a magnetic field guiding a tertiary charged particle generated from the face of the conductive film opposed to the sample in a direction of the charged particle detector at a space between the conductive film and the charged particle detector.

6. The charged particle radiation device according to claim 1, further comprising a holder attached to a linear guide,
wherein the holder holds a plurality of conductive films each having a different thicknesses,
wherein each of the plurality of conductive films has a center hole allowing the probe to pass through when a respective conductive film of the plurality of conductive films is used.

7. A method of detecting charged particles of a charged particle radiation device, comprising:
irradiating a sample with a primary charged particle beam; and
detecting, by a charged particle detector, secondary charged particles transmitted from a conductive film having a thickness which are generated from the sample by irradiating the sample with the primary charged particle beam,
wherein the conductive film is provided at a position between the sample stage and the aperture, except within a path of the primary charged particle beam, and
wherein a distance between a sensing surface of the charged particle detector and the sample stage is greater than a distance between the sample stage and the conductive film,
wherein the surface of the conductive film and the sensing surface of the detector are inclined with respect to each other, and
wherein the thickness of the conductive film and the angle of inclination of the surface of the conductive film relative to the sensing surface of the detector allows for band-pass detection of only secondary charged particles having an energy within a predetermined range having a lower limit and an upper limit.

8. The method of detecting charged particles according to claim 7, wherein the conductive film is arranged substantially perpendicular to an optical axis of the primary charged particle beam within +/−10 degrees, and an angle between the conductive film and the sensing surface of the detector falls in a range of 30 to 150 degrees.

9. The method of detecting charged particles according to claim 7, wherein the conductive film is arranged relative to the optical axis of a primary charged particle beam within an angle of 100 to 150 degrees therebetween, and an angle between the conductive film and the sensing surface of the detector falls in a range of 30 to 150 degrees.

10. The method of detecting charged particles according to claim 7, wherein a thickness of the conductive film falls in a range of 10 to 50000 nm.

11. The charged particle radiation device according to claim 7, further comprising a holder attached to a linear guide,
wherein the holder holds a plurality of conductive films each having a different thicknesses,
wherein each of the plurality of conductive films has a center hole allowing the probe to pass through when a respective conductive film of the plurality of conductive films is used.

* * * * *